United States Patent
Shen et al.

(10) Patent No.: US 8,275,071 B2
(45) Date of Patent: Sep. 25, 2012

(54) COMPACT DUAL RECEIVER ARCHITECTURE FOR POINT TO POINT RADIO

(75) Inventors: Ying Shen, Chapel Hill, NC (US); Guy Theberge, Saint Joseph du Lac (CA); Richard Bourdeau, Saint Laurant (CA); Luc Villeneuve, Lorraine (CA); Fabio Concilio, Dollard-des-Ormeaux (CA); Thanh Nguyen, Dollard-des-Ormeaux (CA)

(73) Assignee: Harris Stratex Networks Operating Corporation, Morrisville, NC (US)

( * ) Notice: Subject to any disclaimer, the term of this patent is extended or adjusted under 35 U.S.C. 154(b) by 851 days.

(21) Appl. No.: 11/750,209

(22) Filed: May 17, 2007

(65) Prior Publication Data
US 2008/0285684 A1 Nov. 20, 2008

(51) Int. Cl.
*H03K 9/00* (2006.01)
*H04L 27/00* (2006.01)

(52) U.S. Cl. ...................................... 375/316
(58) Field of Classification Search .................. 375/259, 375/260, 316, 322, 324, 327, 344, 345, 350, 375/130, 133, 219, 299; 455/112, 272, 296, 455/313, 323, 314
See application file for complete search history.

(56) References Cited

U.S. PATENT DOCUMENTS

| | | | |
|---|---|---|---|
| 4,961,190 A | | 10/1990 | Nakajima |
| 5,125,008 A | * | 6/1992 | Trawick et al. ............. 375/349 |
| 5,230,097 A | * | 7/1993 | Currie et al. ............. 455/226.1 |
| 5,329,520 A | | 7/1994 | Richardson et al. |
| 5,437,051 A | * | 7/1995 | Oto ............................. 455/3.02 |
| 5,451,818 A | | 9/1995 | Chan et al. |
| 5,740,157 A | | 4/1998 | Demiray et al. |

(Continued)

FOREIGN PATENT DOCUMENTS
JP 7249944 9/1995
(Continued)

OTHER PUBLICATIONS
Search Report and Written Opinion mailed Jul. 7, 2008 from International Serial No. PCT/US2008/52359 filed Jan. 29, 2008.
(Continued)

*Primary Examiner* — David C. Payne
*Assistant Examiner* — Syed Haider
(74) *Attorney, Agent, or Firm* — Sheppard, Mullin, Richter & Hampton LLP

(57) ABSTRACT

A radio frequency receiver comprising a receiver module, an intermediate frequency ("IF") module, a synthesizer module and a controller module. The receiver module receives a radio frequency signal and provides a baseband in-phase signal and a baseband quadrature signal, eliminates a sideband of the in-phase and quadrature signals to create a first and a second signal, downconverts the first and second signal to a first and a second IF signal, and selects one of the first or second IF signals. The IF module receives the first or second IF signal, performs analog-to-digital conversion on the first or second IF signal, and demodulates the digitally converted IF signal. The synthesizer module receives a programmable reference signal, downconverts the reference signal to an IF feedback signal, downconverts the reference signal to a baseband feedback signal, provides the IF feedback signal to the IF module, and provides the baseband feedback signal to the receiver module. The controller module samples the digitally converted IF signal and provides the programmable reference signal to the synthesizer module to thereby provide a demodulated output signal.

26 Claims, 23 Drawing Sheets

U.S. PATENT DOCUMENTS

| | | | |
|---|---|---|---|
| 5,742,639 A * | 4/1998 | Fasulo et al. | 375/219 |
| 5,770,971 A | 6/1998 | McNicol | |
| 5,774,784 A | 6/1998 | Ohno | |
| 5,797,043 A | 8/1998 | Lewis et al. | |
| 5,822,553 A | 10/1998 | Gifford et al. | |
| 5,956,324 A | 9/1999 | Engdahl et al. | |
| 5,991,312 A | 11/1999 | Koenig et al. | |
| 6,114,986 A | 9/2000 | Cassen et al. | |
| 6,498,551 B1 | 12/2002 | Ammar et al. | |
| 6,513,092 B1 | 1/2003 | Gorshe | |
| 6,531,982 B1 * | 3/2003 | White et al. | 342/357.46 |
| 6,560,202 B1 | 5/2003 | Bordogna et al. | |
| 6,563,883 B1 | 5/2003 | Leinonen et al. | |
| 6,594,479 B2 | 7/2003 | Ammar et al. | |
| 6,603,810 B1 | 8/2003 | Bednekoff et al. | |
| 6,687,217 B1 | 2/2004 | Chow et al. | |
| 6,819,720 B1 * | 11/2004 | Willetts | 375/296 |
| 6,943,627 B2 | 9/2005 | Leyonhjelm et al. | |
| 6,947,711 B1 | 9/2005 | Leyonhjelm | |
| 6,950,654 B2 | 9/2005 | Jao et al. | |
| 6,998,708 B2 | 2/2006 | Ammar | |
| 7,016,435 B2 | 3/2006 | Adachi | |
| 7,031,409 B2 | 4/2006 | Brobston et al. | |
| 7,058,369 B1 | 6/2006 | Wright et al. | |
| 7,099,399 B2 | 8/2006 | McCallister | |
| 2001/0046239 A1 * | 11/2001 | Colombo et al. | 370/474 |
| 2002/0093393 A1 | 7/2002 | Henningsson et al. | |
| 2002/0097737 A1 | 7/2002 | Traverso et al. | |
| 2002/0111150 A1 | 8/2002 | Pleasant et al. | |
| 2002/0123364 A1 | 9/2002 | Palmeri et al. | |
| 2002/0154620 A1 * | 10/2002 | Azenkot et al. | 370/347 |
| 2003/0162522 A1 | 8/2003 | Valtolina et al. | |
| 2003/0199283 A1 | 10/2003 | Busch | |
| 2004/0052320 A1 | 3/2004 | Lennen | |
| 2004/0203709 A1 | 10/2004 | Luneau | |
| 2004/0263378 A1 * | 12/2004 | Jossef et al. | 342/20 |
| 2005/0053008 A1 | 3/2005 | Griesing et al. | |
| 2005/0105642 A1 | 5/2005 | Muller et al. | |
| 2005/0156662 A1 | 7/2005 | Raghupathy et al. | |
| 2005/0195919 A1 | 9/2005 | Cova | |
| 2005/0260961 A1 * | 11/2005 | Cowley et al. | 455/191.1 |
| 2006/0049870 A1 | 3/2006 | Helberg | |
| 2006/0078069 A1 * | 4/2006 | Seendripu et al. | 375/316 |
| 2006/0089114 A1 | 4/2006 | Maxim et al. | |
| 2006/0112075 A1 | 5/2006 | Hellerstein et al. | |
| 2006/0112175 A1 | 5/2006 | Sellers et al. | |
| 2006/0141974 A1 | 6/2006 | Campbell et al. | |
| 2006/0223474 A1 * | 10/2006 | Yoshizaki et al. | 455/252.1 |
| 2007/0019109 A1 * | 1/2007 | Lombardi et al. | 348/536 |
| 2007/0064835 A1 * | 3/2007 | Auranen | 375/316 |
| 2007/0076818 A1 * | 4/2007 | Barnes et al. | 375/316 |

FOREIGN PATENT DOCUMENTS

JP  2003078356  3/2003

OTHER PUBLICATIONS

Search Report and Written Opinion mailed Apr. 11, 2008 from International Serial No. PCT/US2007/88655 filed Dec. 21, 2007.

Search Report and Written Opinion mailed May 20, 2008 from International Serial No. PCT/US2008/51210 filed Jan. 16, 2008.

* cited by examiner

COMPACT DUAL RECEIVER ARCHITECTURE FOR POINT TO POINT RADIO

RELATED APPLICATIONS

The instant application is related to U.S. application Ser. No. 11/670,952, filed Feb. 2, 2007, entitled "Packaging for Low-Cost, High-Performance Microwave and Millimeter Wave Modules," the entirety of which is incorporated herein by reference. The instant application is related to U.S. application Ser. No. 11/655,837, filed Jan. 22, 2007, now U.S. Pat. No. 7,782,765, entitled "Distributed Protection Switching Architecture for Point-to-Point Microwave Radio Systems," the entirety of which is incorporated herein by reference. The instant application is related to U.S. application Ser. No. 11/570,231, filed May 17, 2007, now U.S. Pat. No. 8,095,088, entitled "Compact Wide Dynamic Range Transmitter For Point To Point Radio," the entirety of which is incorporated herein by reference.

BACKGROUND

Electrical signals have proven to be an effective means of conveying data from one location to another. The further a signal is transmitted, however, the greater the decay in the signal and the greater the chance for irreversible loss in the data represented by the signal. In order to guard against this signal decay, the core electrical signal that represents the data (i.e., the baseband signal) may be modulated or superimposed on a carrier wave in the Radio Frequency ("RF") frequency spectrum.

In order to properly interpret the signal, conventional RF receivers extract the baseband signal from the received signal. The data represented by the extracted baseband signal may then be interpreted by other downstream circuitry. In order to perform this extraction, typical receivers include circuitry which first converts the received radio frequency modulated signal into an intermediate frequency ("IF") signal. This IF signal is then converted into the baseband signal for further data processing. Receiver architectures that convert through the intermediate frequency are often called "heterodyne" receiver architectures. Naturally, circuit elements (called "IF components") are required in order to deal with the intermediate conversion to and from the intermediate frequency.

It is desirable to reduce the cost, size, and power consumption of a particular receiver architecture design for strategic marketing of the receiver. One technology developed in order to reduce RF receiver cost, size, and power consumption is generally termed direct conversion. Direct conversion refers to the direct conversion of RF modulated signals into corresponding baseband signals without requiring conversion through the intermediate frequency. Such direct conversion receiver architectures are often also called zero-IF, synchrodyne, or homodyne receiver architectures.

FIG. 1 is an illustration of a conventional direct conversion circuit 100 in accordance with the prior art. With reference to FIG. 1, the circuit 100 includes an antenna 101 which receives the RF modulated signal. The antenna 101 then provides the received signal to an amplifier 102 which amplifies the signal for further processing. The amplifier 102 may be, for example, an RF low noise amplifier. The amplified signal is then split into two branches, an in-phase ("I") branch 110, and a quadrature-phase ("Q") branch 120. Each branch includes a mixer that initially receives the amplified signal. For instance, the in-phase branch 110 includes an in-phase mixer 111, and the quadrature-phase branch 120 includes a quadrature-phase mixer 121. A local oscillator 130 generally provides a sine or square wave signal as a control signal to each of the mixers. Each mixer is configured to nonlinearly process the amplified signal and control signal, resulting in output signal components at frequencies equal to the sum and difference of amplified signal and control signal frequencies, plus higher-order components at other frequencies. The circuit includes a ninety degree phase shifter 131 which causes the control signal for the quadrature-phase mixer 121 to be ninety degrees out of phase with the control signal for the in-phase mixer 111. The signal from the in-phase mixer 111 is then passed through a low pass filter 112 to a baseband amplifier 113 to complete the extraction of the baseband signal from the received signal as far as the in-phase branch 110 is concerned. Likewise, the signal from the quadrature-phase mixer 121 is passed through a low pass filter 122 to a baseband amplifier 123 to complete the extraction of the baseband signal as far as the quadrature-phase branch is concerned. The in-phase and quadrature-phase baseband signals are then processed by signal processing circuitry 150.

A conventional intermediate conversion circuit in accordance with the prior art would be similar to the direct conversion circuit of FIG. 1 with the addition of IF components to convert the received modulated RF signal through an intermediate frequency. While direct conversion, circuits may generally be smaller and require less power than conventional heterodyne receiver architectures, direct conversion architectures characteristically introduces more DC offset and 1/f noise than do heterodyne receiver architectures thereby limiting dynamic range.

Furthermore, it is often desirable to implement antenna diversity in any receiver architecture. Antenna diversity involves the use of more than one antenna to receive a signal to improve the ability to properly receive the signal. When using one antenna to receive a signal, the signal may have actually taken several paths from the transmitter to the receiver, each having a different length. This causes an echo effect that might actually lead to destructive interference between the signals receive from different paths. The use of two or more antennas that are appropriately spaced reduces the degradation due to the echo effect since the echo at one antenna will typically be different than the echo at another, thereby reducing the likelihood that the echo would degrade the signal.

Thus, a continuing need exists for an improved receiver architecture, particularly for microwave and millimeter wave systems operating in higher frequency ranges. As greater uses are made for microwave and millimeter wave radio systems, it would be advantageous if a unique receiver architecture could be found that addressed the low cost and performance requirements in the area of millimeter wave and microwave communications systems without degradation to the technical performance of a respective transceiver, transmitter, or receiver and/or communication system.

SUMMARY

Various embodiments of the present invention are based, in part, on the foregoing observations. Examples of such embodiments are provided herein.

One such embodiment of the present subject matter provides a radio frequency receiver comprising a receiver module which receives an RF signal and provides a baseband in-phase ("I") signal and a baseband quadrature ("Q") signal, eliminates a sideband of the I signal and a sideband of the Q signal to create a first and a second signal, downconverts the first and second signal to a first and a second intermediate frequency signal ("IF"), and selects one of the first or second IF signals. The receiver also comprises an IF module which receives the first or second IF signal, performs analog-to-digital conversion on the first or second IF signal, and demodulates the digitally converted IF signal. The receiver further comprises a synthesizer module which receives a programmable reference signal, downconverts the reference signal to an IF feedback signal, downconverts the reference signal to a baseband feedback signal, provides the IF feedback signal to the IF module, and provides the baseband feedback signal to the receiver module. The receiver also includes a controller module which samples the digitally converted IF signal and provides the programmable reference signal to the synthesizer module to thereby provide a demodulated output signal. An alternative embodiment of the present subject matter may also include a digital detector in the controller module such as a field programmable gate array ("FPGA"). Further embodiments of the present subject matter may include a temperature compensation module such as a temperature sensor located in proximity to the IF module.

Another embodiment of the present subject matter provides a radio frequency receiver system comprising an electronics rack having an electrical backplane, a plurality of RF receivers each operatively connected to the backplane, and a data processing unit ("DPU") operatively connected to the backplane, the DPU having a first and a second common reference signal generator. Each receiver may comprise a receiver module which receives an RF signal and provides a baseband in-phase ("I") signal and a baseband quadrature ("Q") signal, eliminates a sideband of the I signal and a sideband of the Q signal to create a first and a second signal, downconverts the first and second signal to a first and a second intermediate frequency signal ("IF") and selects one of the first or second IF signals. Each receiver may further comprise an IF module which receives the first or second IF signal, performs analog-to-digital conversion on the first or second IF signal, and demodulates the digitally converted IF signal. Each receiver may also comprise a synthesizer module which receives a programmable reference signal, downconverts the reference signal, to an IF feedback signal, downconverts the reference signal to a baseband feedback signal, provides the IF feedback signal to the IF module, and provides the baseband feedback signal to the receiver module. Each receiver may include a programmable reference signal generator which samples the digitally converted IF signal and provides the programmable reference signal to the synthesizer module to thereby provide a demodulated output signal and may include a frequency locking circuit. In one embodiment of the present subject matter each of the common reference generators may be switchably connected to the programmable reference signal generator via the frequency locking circuit. In an additional embodiment of the present subject matter the DPU may further comprise a second switch adaptable to switch from a first of the plural receivers to a second of the plural receivers. An alternative embodiment of the present subject matter may include a controller module that further comprise a digital detector, such as an FPGA. A further embodiment may also comprise a temperature compensation module including a temperature sensor located in proximity to the IF module.

An additional embodiment of the present subject matter provides a method for receiving a signal. The method may comprise the steps of providing a co-located modem and receiver in an assembly, receiving a baseband signal at a receiver module in the receiver, and providing a baseband I signal and a baseband Q signal. A sideband of the I and Q signals may be eliminated to create a first and a second signal and these first and second signals may be downconverted to a first and a second IF signal. One of the first or second IF signals may be selected and an analog-to-digital conversion performed thereon. The method may further comprise the steps of sampling the digitally converted IF signal, providing a reference signal as a function of the sampled IF signal, providing a baseband feedback signal to the receiver module as a function of the reference signal, and providing an IF feedback signal to the IF module as a function of the reference signal. The digitally converted IF signal may then be demodulated to provide a demodulated output signal. An alternative embodiment may also provide thermal compensation for temperature changes in the receiver. An additional embodiment may include the step of switching to a standby receiver to receive the baseband signal if the receiver fails. A further embodiment may also monitor received signal strength.

These embodiments and many other features and advantages thereof will be readily apparent to one skilled in the art to which the invention pertains from a perusal of the claims, the appended drawings, and the following detailed description of the embodiments.

DETAILED DESCRIPTION

Figure 1:
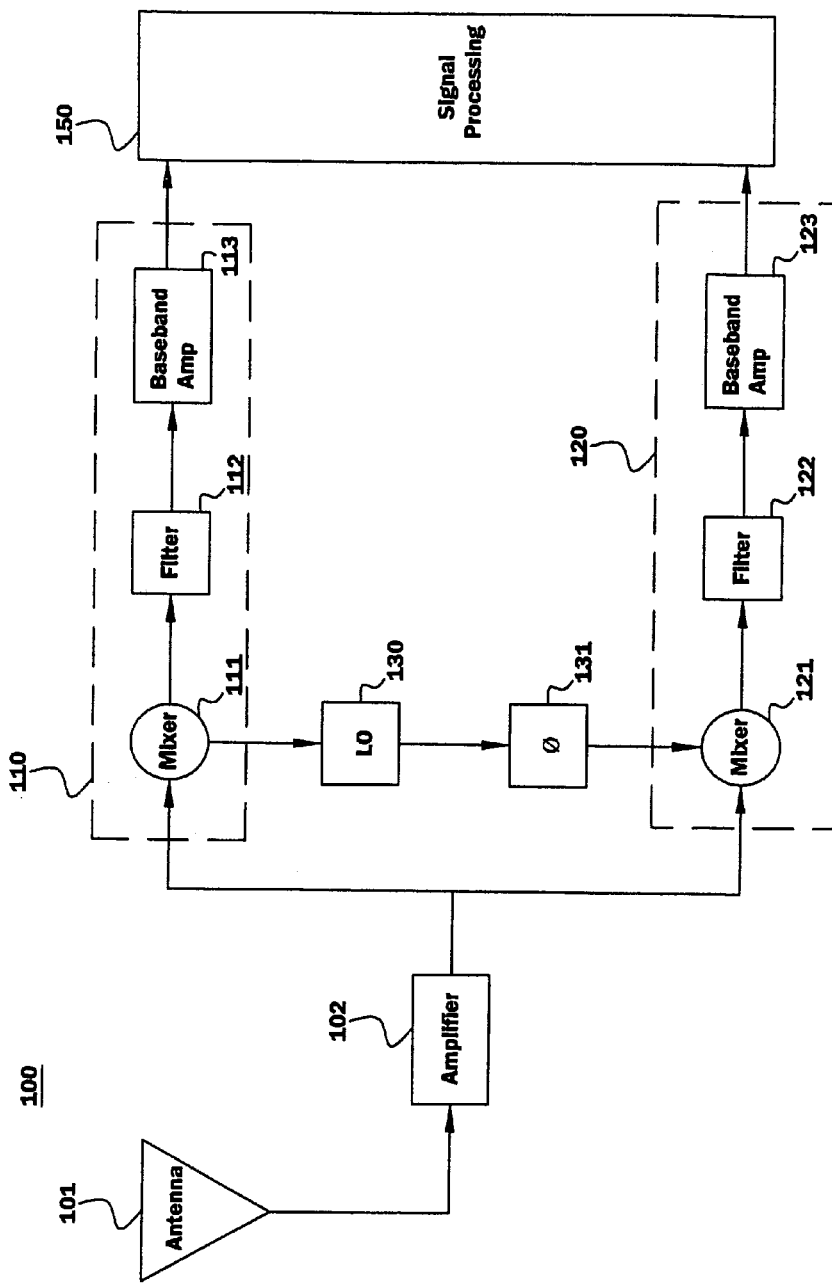
FIG. 1 is an illustration of a conventional direct conversion circuit in accordance with the prior art.

With reference to the figures where like elements have been given like numerical designations to facilitate an understanding of the present subject matter, the various embodiments of a system, method and apparatus for a radio frequency receiver are herein described.

The present subject matter generally describes, a radio frequency ("RF") system adaptable to communicate in the 6-11 GHz frequency bands. The RF system may be capacity/modulation independent and support a capacity range of, but not limited to, 8T1 through 4DS3 and support modulation such as, but not limited to, 32 QAM through 256 QAM. The aforementioned frequency bands and ranges are exemplary only and should not in any way limit the scope of the claims appended herewith. The RF system may be configured as an indoor radio or an outdoor radio and may be partitioned onto a signal processing unit and an RF unit. The RF unit may generally connect to an antenna unit through a coupler such as an antenna coupling unit. Interconnections between the RF unit and signal processing unit may generally be via a back plane. The RF unit may be optimized for separate transmitter and receiver operation for the consideration of minimum traffic interruption when there is a failure in either direction. Further, for cost and performance considerations, the transmitter may be co-located with a modulator and digital-to-analog converter ("DAC"), and the receiver is co-located with a demodulator and analog-to-digital converter ("ADC"). Furthermore, the receiver aspect may be optimized for a plurality of receivers.

An exemplary radio system may provide a plurality of radio configurations. For example, a radio system according to the present subject matter may be non-protected ("NP") (e.g., N+0, N=1 to 4, etc.), NP with space diversity, monitored hot standby ("MHSB") with and/or without space diversity, MHSB with split transmit with and/or without space diversity, hybrid diversity, frequency diversity (e.g., 1:N, N=3, etc.), and cross polarization interference cancellation ("XPIC"). For example, in the case of MHSB, two receiver RF couplers may be utilized such as an equal loss splitter or an unequal loss coupler having a predetermined differential loss between the main and standby receivers. Antenna coupler units may support configurations of transmitters and/or receivers having the same or split polarization and may be mounted as a function of RF system gain.

An exemplary RF unit may comprise an antenna coupling unit, the appropriate mounting mechanics, a transmitter, transceiver, and/or receiver. Depending upon the various antenna coupling unit and diplexer configurations, the RF unit may be configured into NP, MHSB, frequency diversity, space diversity and hybrid diversity. The RF unit may be utilized in indoor and/or outdoor applications and generally, the corresponding antenna(s) may be mounted in an outdoor environment and separately from the RF unit with an extended waveguide connection thereto. Of course, if the RF unit is positioned in the outdoor environment, the RF unit may be integrated with an antenna.

Figure 2:
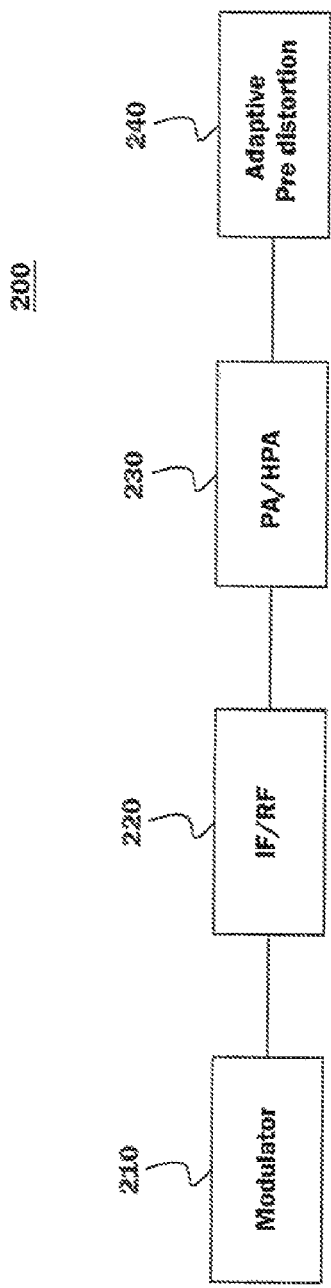
FIG. 2 is a block diagram of a transmitter according to an embodiment of the present subject matter.

FIG. 2 is a functional diagram of a transmitter according to an embodiment of the present subject matter. With reference to FIG. 2, a transmitter 200 may generally comprise four primary functional blocks including, but not limited to, a modulator 210, transmitter IF/RF processing circuitry 220, power amplification or high power amplification circuitry 230, and/or adaptive pre-distortion feedback circuitry 240. Exemplary transmitters according to embodiments of the present subject matter may provide fully agile radio over a wide range of frequency bands, may be capacity/modulation independent, and provide remote RF synthesizer frequency settings and transmit output power settings. Further embodiments may provide remote system diagnostics, automatic transmit power control ("ATPC"), remote transmit power control ("RTPC"), thermal management in an ATPC/RTPC mode, and adaptive pre-distortion functions. Alternative embodiments may provide in-service error vector magnitude ("EVM") measurement, an RF monitor port, a highly integrated RF/modulator transmitter, an output power field adjustable/sellable feature though the RF monitoring port, coherent transmitters within the same radio shelf, and a continuous wave ("CW") mode.

Figure 3:
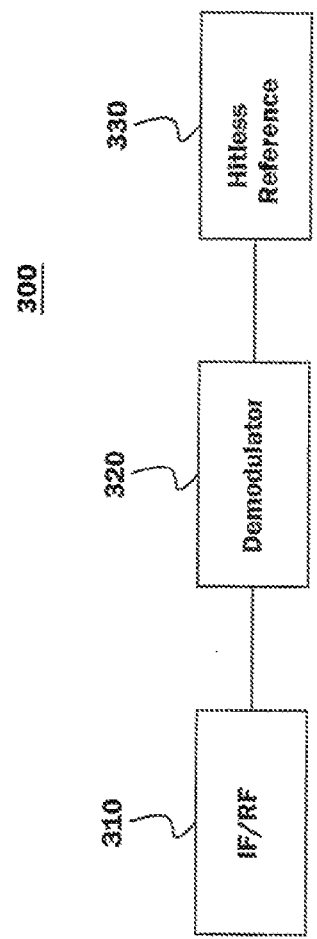
FIG. 3 is a block diagram of a receiver according to an embodiment of the present subject matter.

FIG. 3 is a functional diagram of a receiver according to an embodiment of the present subject matter. With reference to FIG. 3, a receiver 300 may generally comprise of three primary functional blocks including, but not limited to, receiver IF/RF processing circuitry 310, a demodulator 320 and/or hitless reference circuitry for an XPIC option 230. Exemplary receivers according to embodiments of the present subject matter may provide fully agile radio over a wide range of frequency bands, may be capacity/modulation independent, and provide remote RF synthesizer frequency settings. Further embodiments may provide remote system diagnostics, a hitless receiver for cross polarization interference cancellation ("XPIC") applications, a dual port receiver for 1:N space diversity, and a DFM test port. Alternative embodiments may provide a highly integrated RF/demodulator receiver, a received signal strength indicator ("RSSI") monitor port, and provide coherent receivers within the same radio shelf. Embodiments of the present subject matter may support the receiver specifications listed below in Table 1; however, such a listing should not in any way limit the scope of the claims appended herewith.

TABLE 1

| | |
|---|---|
| Frequency range | 6 GHz: 5725-7125 MHz |
| | 7/8 GHz: 7110-8500 MHz |
| | 10/11 GHz: 10500-11700 MHz |
| Noise Figure at antenna port (including 1.5 dB antenna coupling loss with external cable and isolator) | 6 GHz: <=4 dB at room, <=4.5 dB over temp. |
| | 7/8 GHz: <=4 dB at room, <=4.5 dB over temp. |
| | 10/11 GHz: <=4.5 dB at room, <=5 dB over temp. |
| AGC dynamic range | −90 dBm to −15 dBm |
| MGC mode activation | Through software for debug purposes |
| Receiver Overload Level with no damage | +0 dBm |
| Frequency Source/LO | Synthesizable |
| Frequency Tuning Range | Whole frequency bands |
| Frequency Step size | 6/7/8 GHz: 5 kHz |
| | 10/11 GHz: 125 kHz |
| Frequency Setting | Programmable through software |
| Isolation from Rx1 to Rx 2 or Rx2 to Rx 1 | 90 dB min. |
| Image Rejection @280 MHz offset | −80 dBc min. |
| Total Spurious Power at IF output | <−75 dBm at IF +/− 20 MHz |
| Spurious at Receiver Input | <=−50 dBm when F <= 21.2 GHz |
| | <=−30 dBm when F > 21.2 GHz |
| RF unit group delay distortion within 1 dB bandwidth | 45 MHz: <=25 ns |
| | 12 MHz: <=35 ns |
| | 5 MHz: <=40 ns |
| RF unit amplitude flatness response (IF filter BW option) | 45 MHz: <=1 dB; rejection 10 dB min @ +/−40 MHz offset |
| | 12 MHz: <=1 dB; rejection 10 dB min @ +/−20 MHz offset |
| | 5 MHz: <=1 dB; rejection 10 dB min @ +/−10 MHz offset |
| Phase noise at carrier frequency (SSB) | IPN 25 kHz to 1 MHz: −41.45 dBc/ 0.48 deg. (32 QAM) |
| | IPN 75 kHz to 5 MHz: −44.44 dBc/ 0.34 deg. (64 QAM) |
| | IPN 40 kHz to 2 MHz: −47.61 dBc/ 0.24 deg. (128 QAM) |
| | IPN 250 kHz to 10 MHz: −50.49 dBc/0.17 deg. (256 QAM) |
| Phase hit over temp. for 2 deg/min at transition | 7 KHz max. |
| Receive Synthesizer/LO Alarm Indication | Reported through software |
| Receive Signal Strength Level display | T = 25 C. +/− 10 C. |
| | −25 dBm to −50 dBm: +/−1 dB |
| | −25 dBm to −90 dBm: +/−3 dB |
| | <=−95 dBm: +/−4 dB |
| | T <= 16 C. or T >= 36 C. |
| | −25 dBm to −50 dBm: +/−2 dB |
| | −25 dBm to −90 dBm; +/−4 dB |
| | <=−95 dBm: +/−4 dB |
| RSL Display Range | −15 dBm to Threshold ($10^{-6}$) − 5 dB |
| RSL Indication resolution | 1 dB |
| AGC correction speed | >100 dB/s |
| Ouput IF Frequency | 140 MHz +/− 80 kHz |

TABLE 1-continued

| | |
|---|---|
| Return Loss at antenna port | 20 dB min. |
| Returns loss at receiver module input | 17 dB min. |
| Receiver overload | >=−15 dBm for 128 QAM with $10^{-6}$ |
| | >=−17 dBm for 256 QAM with $10^{-6}$ |
| Receiver IM3 requirement | IM3 <−32 dBc for RSL@ −17 dBm (IM3 measured at IF output level) |
| IF Level before ADC | −19 dBm +/− 1 dB |

Figure 4:
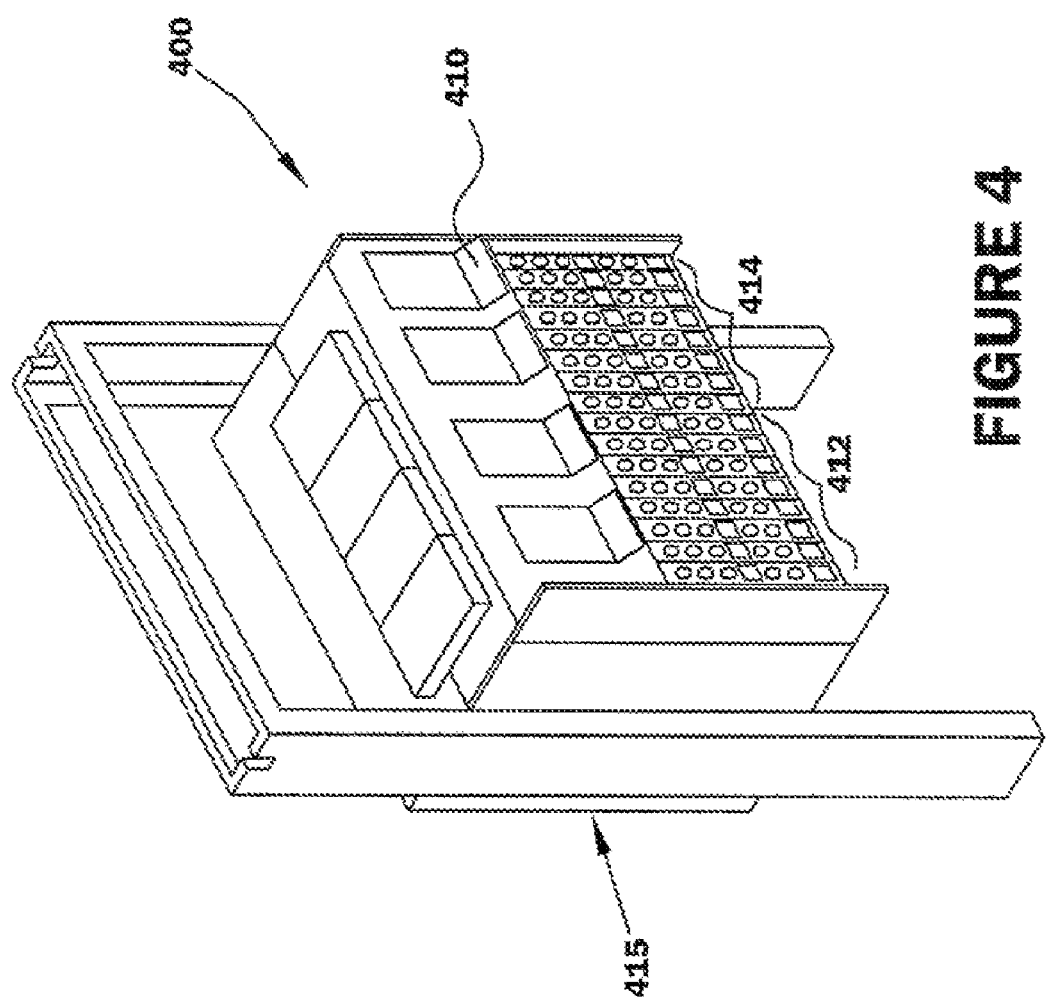
FIG. 4 is an illustration of a radio shelf according to an embodiment of the present subject matter.

An exemplary RF unit may be designed for simple assembly and ease of manufacturing, installation, alignment and replacement and for environmental protection. For example, the housing design of both the transmitter and/or receiver may be comprised of a die-cast enclosure acting as a heat sink and one cover. The transmitter and/or receiver may provide front accessibility for module replacement and rear accessibility for connection to an antenna(s). Exemplary RF units and modules are described in co-pending U.S. application Ser. No. 11/670,952, filed Feb. 2, 2007, and entitled "Packaging for Low-Cost, High-Performance Microwave and Millimeter Wave Modules," the entirety of which is incorporated herein by reference. Plural units 410 or modules of the embodiments described in U.S. application Ser. No. 11/670,952 may be mounted in the same radio shelf 400 depicted in FIG. 4. For example, one radio shelf 400 may accommodate four transmitters 412 and four dual receivers 414 in a single rack 415. While not shown, one radio shelf 400 may also support multiple racks. Embodiments of the present subject matter may thus provide dual receivers in one package. Additional embodiments may provide a single receiver, dual receivers for space diversity configuration and/or dual receivers for XPIC configuration. This dual receiver optimization approach may thus greatly reduce space concerns, provide for shared common key circuitry, reduce interconnections, minimize the overall size and provide a single radio shelf to support plural transmitters and receivers while meeting thermal and power consumption requirements.

Figure 5:
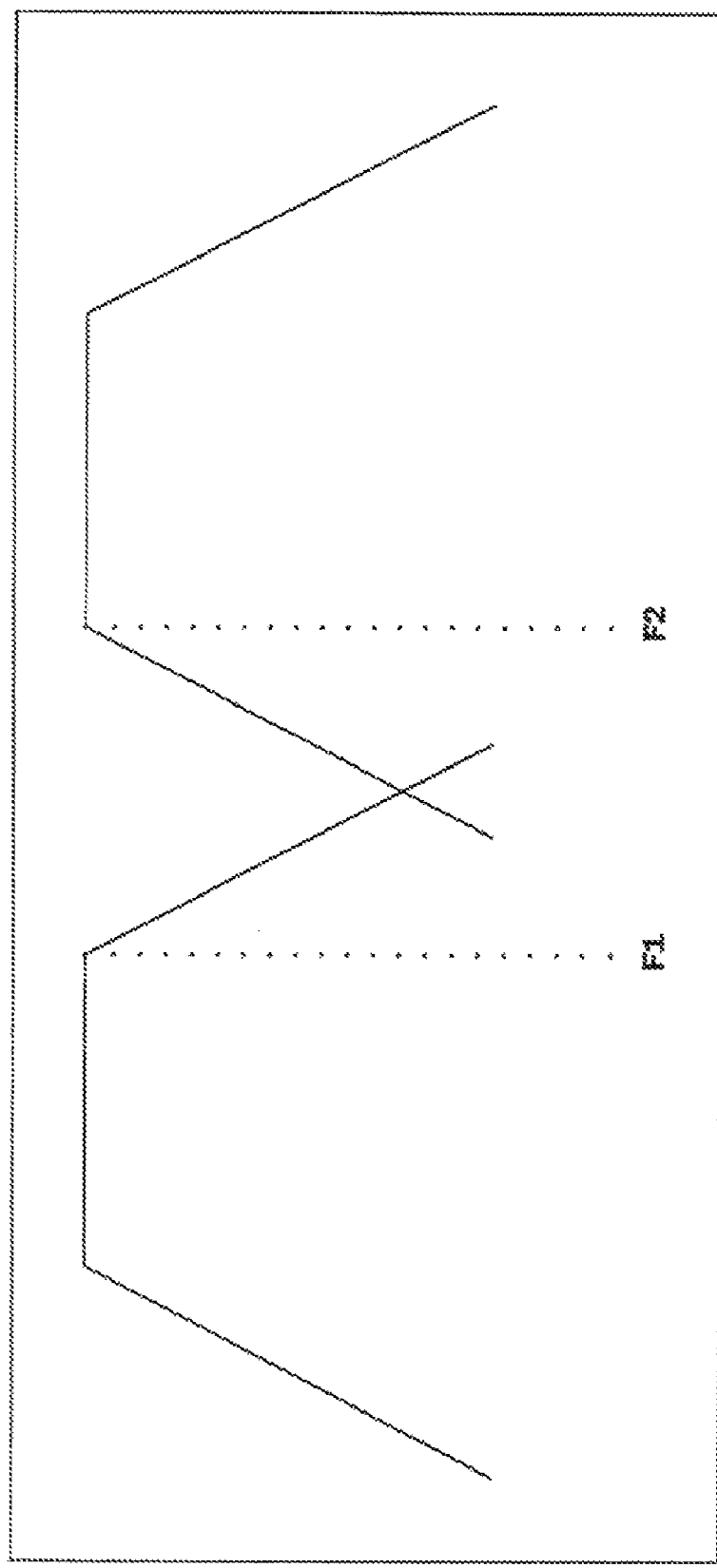
FIG. 5 is a frequency response graph of an antenna coupler unit according to an embodiment of the present subject matter.

If a single antenna is utilized in a radio system employing embodiments of the present subject matter, a passive antenna coupling unit may be employed to perform the separation of transmit and receive signals into and out of an antenna. Depending upon the transmit/receive frequency separation, operating channels, and offered configurations as described above, several antenna coupling unit options may be available. For example, a typical NP antenna coupling unit may include one transmit waveguide filter, one transmit isolator, on receiver waveguide filter, one receiver isolator and one match load. Additionally, in a protected radio, a switch may be utilized for connecting the two transmitter ends to the antenna coupling unit and an equal or unequal couple may teed the receive signal to the two receiver ends. FIG. 5 is a frequency response graph of an antenna coupler unit according to an embodiment of the present subject matter. With reference to FIG. 5, F1 represents the transmitter filter high edge frequency and F2 represents the receiver filter low edge frequency. Thus, the rejection F2 from F1 for a complete transmitter antenna coupling unit may be 72 dB minimum, the rejection F1 from F2 for the receiver antenna coupling unit is 63 dB, and an associated circulator may possess a minimum of 25 dB rejection.

Embodiments of the present subject matter may support the antenna coupling unit configurations listed below in Table 2; however, such a listing should not in any way limit the scope of the claims appended herewith.

TABLE 2

| Description | Mechanical |
|---|---|
| Non-protected (Tx/Rx) | One transmitter, one receiver and one antenna |
| Non-protected Tx, Space Diversity Rx (Tx/Rx, Rx) | One transmitter, two receivers and two antennas |
| Hot Standby Protected Txs and Rxs (Tx/Rx) | Two transmitters, two receivers and one antenna |
| Hot Standby Protected Txs, Space Diversity Rxs (Tx/Rx, Rx) | Two transmitters, two receivers and two antennas |
| Hot Standby Protected Split Txs and Diversity Rxs (Tx/Rx, Tx/Rx) | Two transmitters, two receivers and two antennas |
| Hot Standby, Separate Tx and Rx Antennas (Tx/Rx, Rx/Rx) | Two transmitters, two receivers and two antennas |
| Frequency Diversity Txs and Rxs, Single Antenna (Tx/Tx/Rx/Rx) | Two transmitters, two receivers and one antenna |
| Frequency Diversity Txs and Rxs, Dual Antenna (Tx/Tx, Rx/Rx) | Two transmitters, two receivers and two antennas |
| Non-protected Tx and Rx, Separate Antenna (Tx, Rx) | One transmitter, one receiver and two antennas |
| Hot Standby Protected Txs, Space Diversity Rxs, Three Antennas (Tx, Rx, Rx) | Two transmitters, two receivers and three antennas |
| Non Protected Tx, Space Diversity Rxs, Three Antennas (Tx, Rx, Rx) | One transmitter, two receivers and three antennas |
| 1:3 Frequency Diversity Txs (Txs, Rxs) | Four transmitters, four receivers and two antennas |
| 1:3 Frequency Diversity Txs, Space Diversity Rxs, Three Antennas (Txs, Rxs, Rxs) | Four transmitters, eight receivers three antennas |

Figure 6:
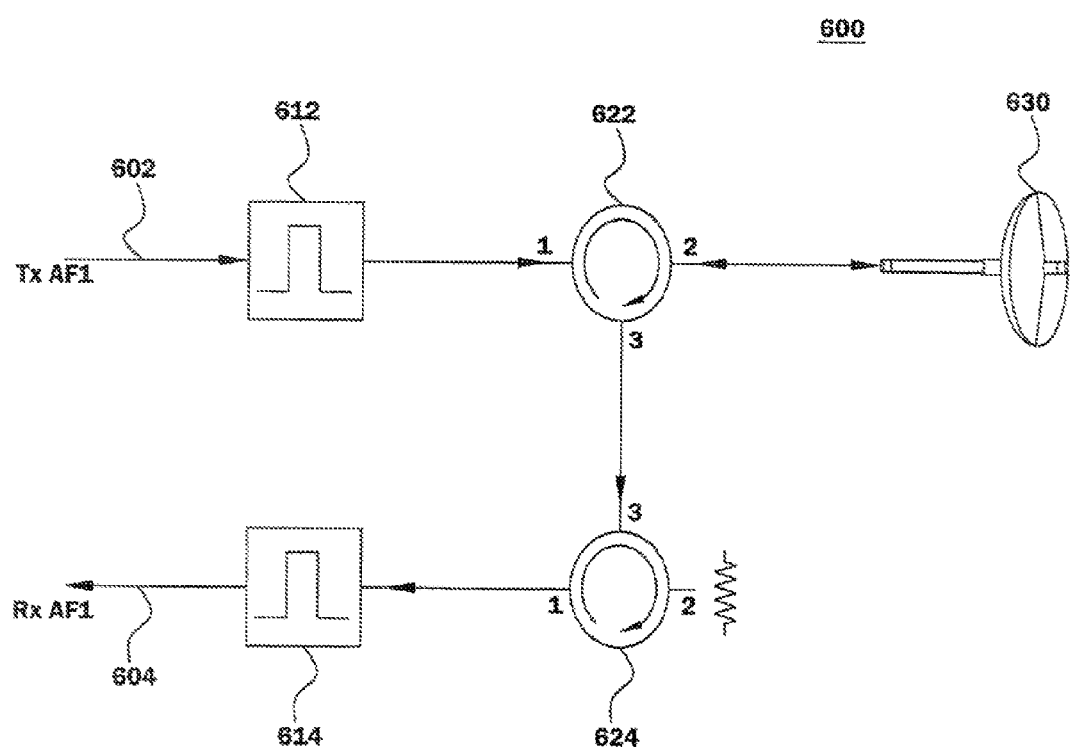
FIGS. 6-18 are simplified diagrams of antenna coupling unit configurations according to embodiments of the present subject matter.

FIGS. 6-18 are simplified block diagrams of the antenna coupling unit configurations identified in Table 2 according to embodiments of the present subject matter. With reference to FIG. 6, a Non-protected Tx and Rx (Tx/Rx) antenna coupling unit configuration 600 is illustrated. The configuration may comprise one non-protected transmitter branch 602 having a corresponding transmit filter 612 connected to a circulator 622. The configuration may further comprise one non-protected receiver branch 604 having a corresponding receive filter 614 connected to a circulator 624 wherein the circulators 614, 624 route the appropriate signals to/from an antenna 630.

Figure 7:
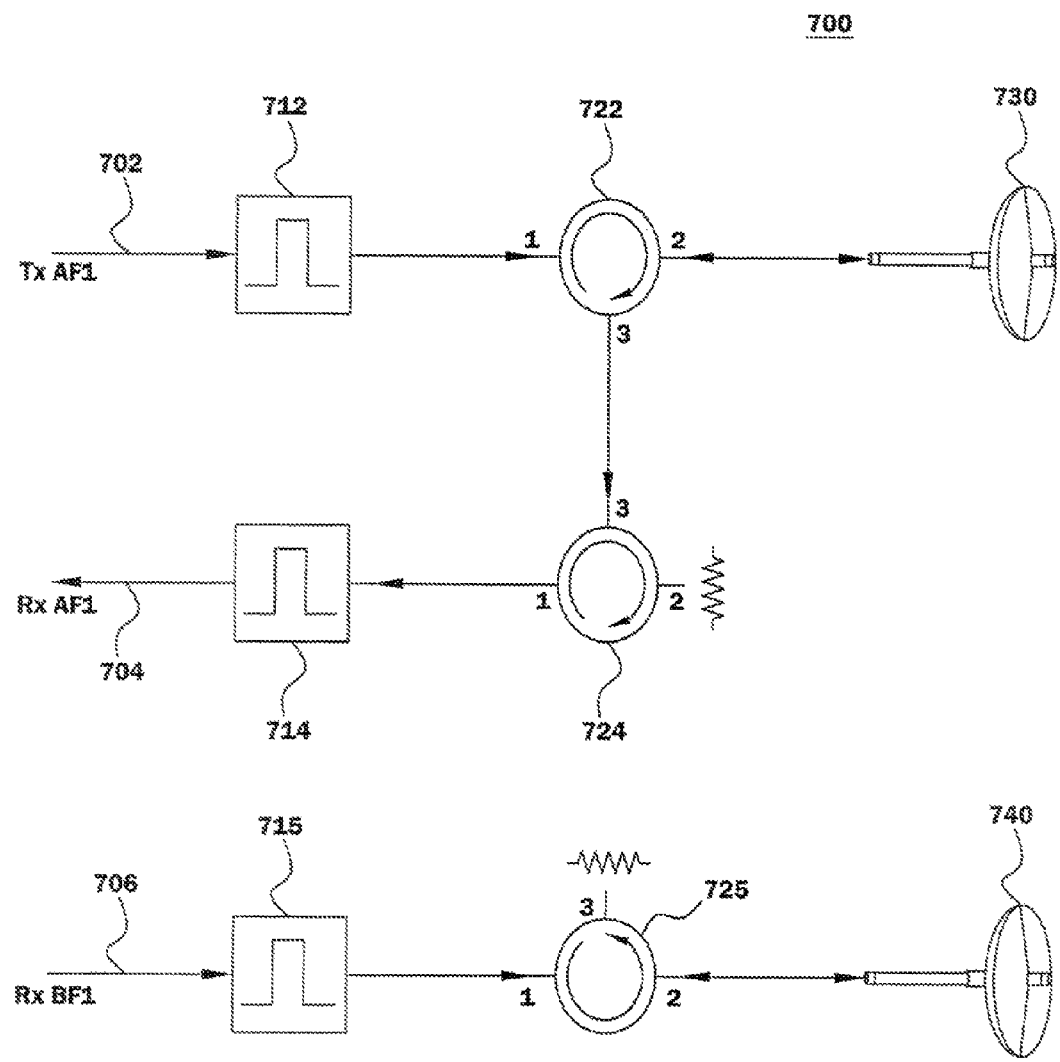

With reference to FIG. 7, a Non-protected Tx, Space Diversity Rx (Tx/Rx, Rx) antenna coupling unit configuration 700 is illustrated. The configuration may comprise one non-protected transmitter branch 702 having a corresponding transmit filter 712 connected to a circulator 722. The configuration may further comprise two space diversity receiver branches 704, 705 having corresponding receive filters 714, 715 connected to circulator 724, 725 wherein the circulators 714, 724, 725 route the appropriate signals to/from the appropriate antennas 730, 740.

Figure 8:
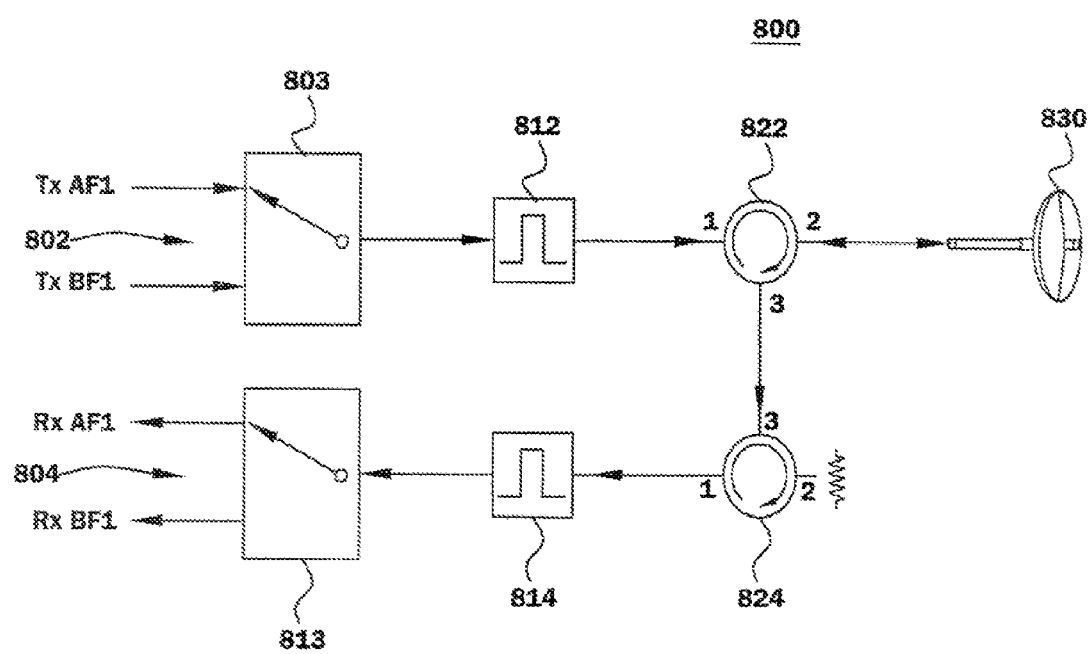

With reference to FIG. 8, a Hot Standby Protected Txs and Rxs (Tx/Rx) antenna coupling unit configuration 800 is illustrated. The configuration may comprise one protected transmitter branch 802 having a selective switch 803 adaptable to select between transmit path AF1 and BF1, a corresponding transmit filter 812 connected to a circulator 822. The configuration may further comprise one protected receiver branch 804 having a selective switch 813 adaptable to select between receiver path AF1 and BF1, a corresponding receive filter 814 connected to a circulator 824 wherein the circulators 814, 824 route the appropriate signals to/from an antenna 830.

Figure 9:
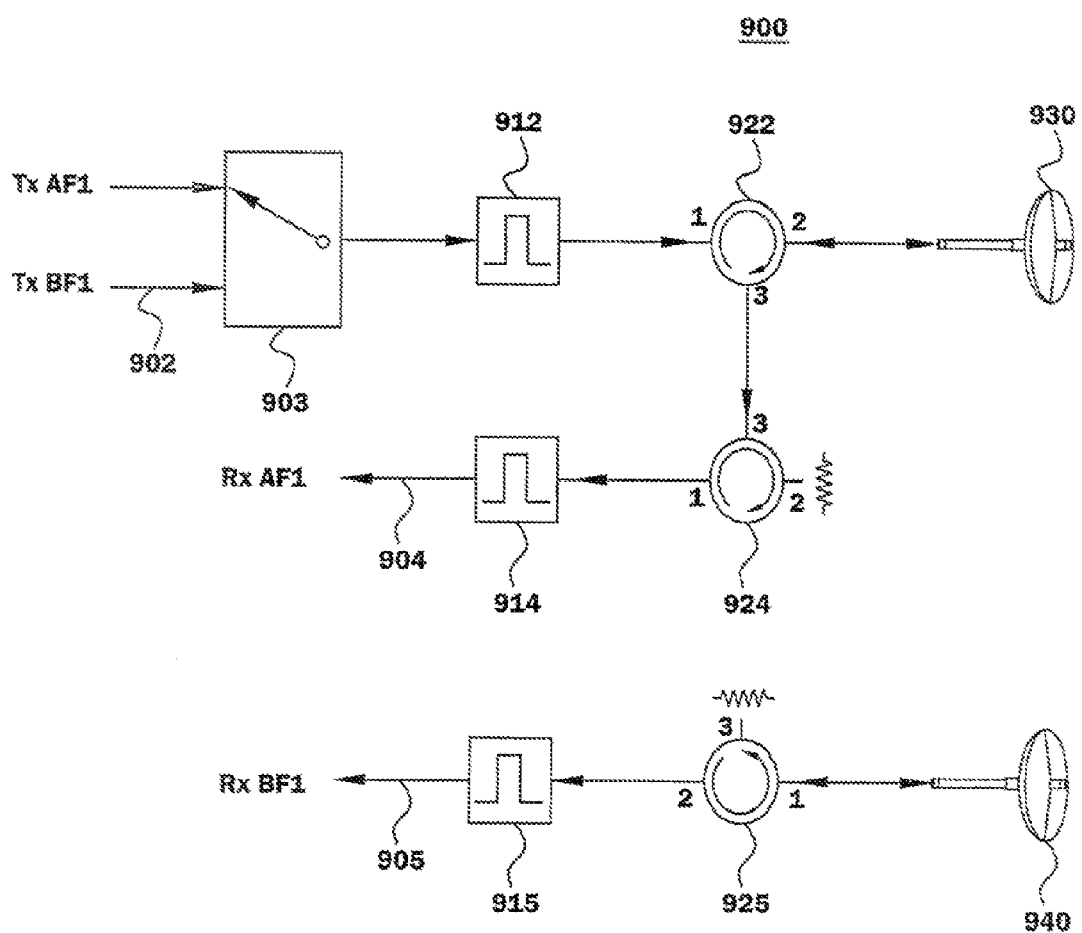

With reference to FIG. 9, a Hot Standby Protected Txs, Space Diversity Rxs (Tx/Rx, Rx) antenna coupling unit configuration 900 is illustrated. The configuration may comprise one protected transmitter branch 902 having a selective switch 903 adaptable to select between transmit path AF1 and BF1, a corresponding transmit filter 912 connected to a circulator 922. The configuration may further comprise two space diversity receiver branches 904, 905, each having corresponding receive filters 914, 915 connected to respective circulators 924, 925 wherein the circulators 922, 924, 925 route the appropriate signals to/from antenna 930, 940.

Figure 10:
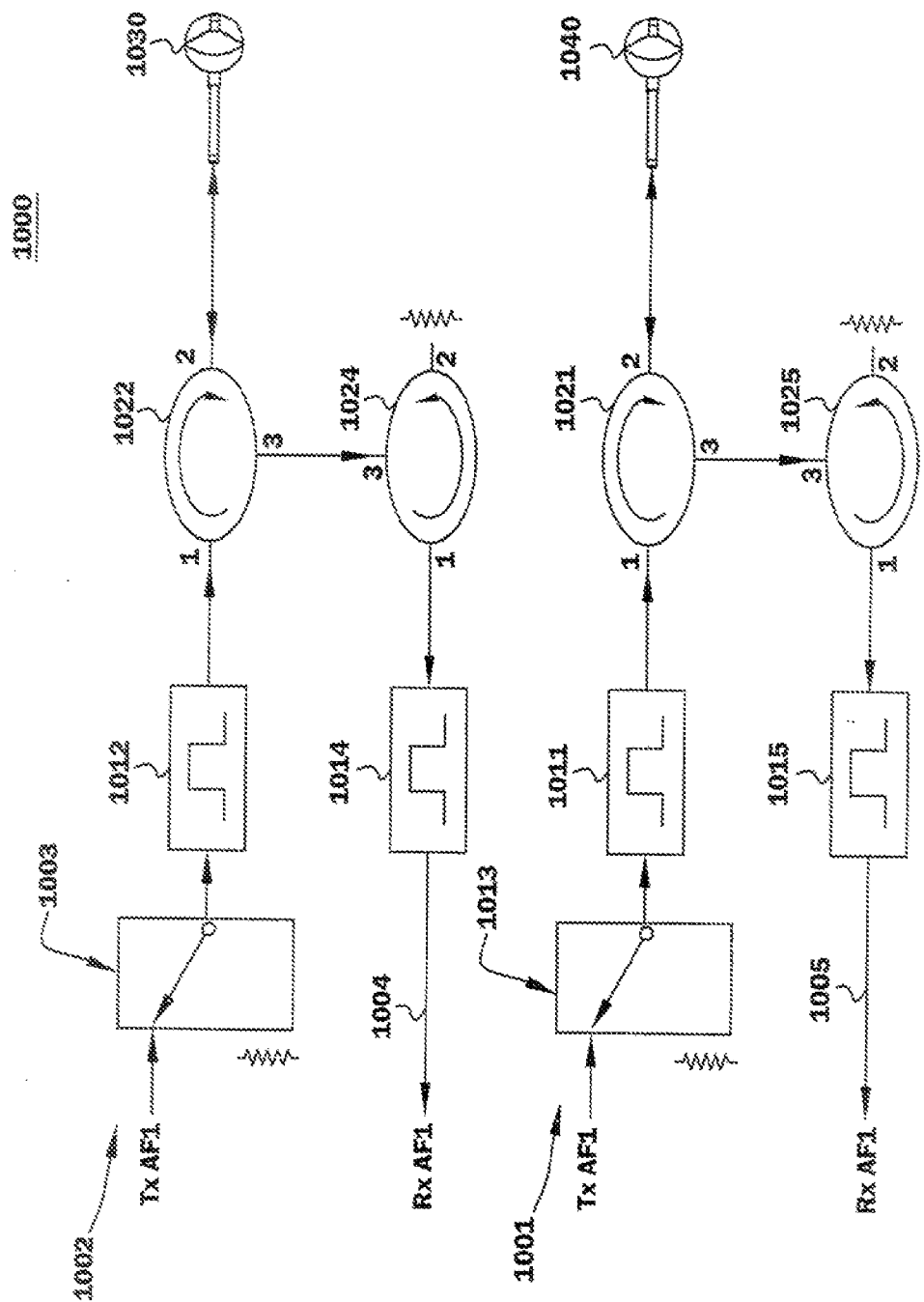

With reference to FIG. 10, a Hot Standby Protected Split Txs and Diversity Rxs (Tx/Rx, Tx/Rx) antenna coupling unit configuration 1000 is illustrated. The configuration may comprise two protected, split transmitter branches 1001, 1002 each having a selective switch 1003, 1013 adaptable to select between the respective transmit path AF1, each branch also having a corresponding transmit filter 1011, 1012 connected to a circulator 1021, 1022. The configuration may further comprise two space diversity receiver branches 1004, 1005, each having corresponding receive filters 1014, 1015 connected to respective circulators 1024, 1025 wherein the circulators 1021, 1022, 1024, 1025 route the appropriate signals to/from antennas 1030, 1040.

Figure 11:
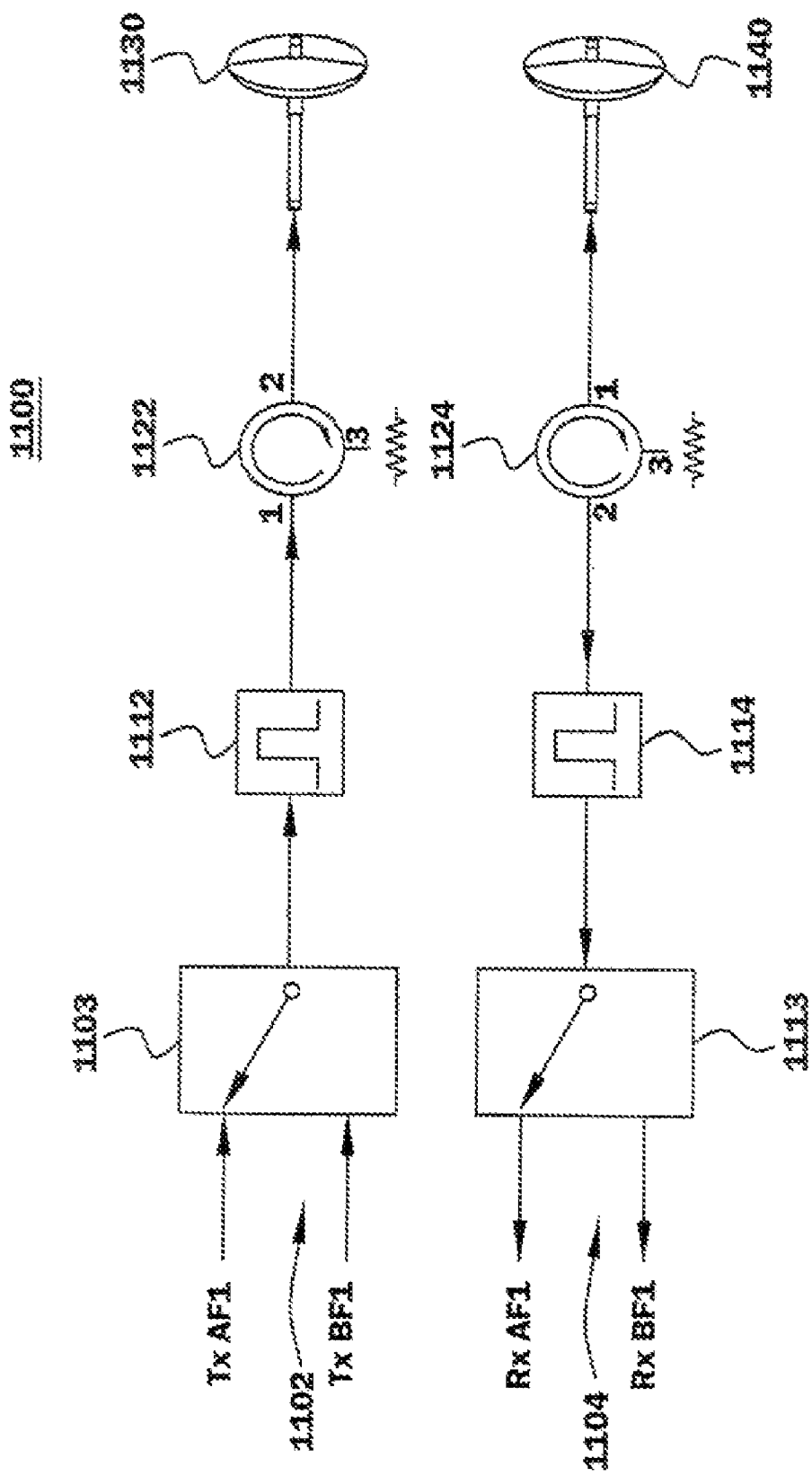

With reference to FIG. 11, a Hot Standby, Separate Tx and Rx Antennas (Tx/Rx, Rx/Rx) antenna coupling unit configuration 1100 is illustrated. The configuration may comprise one protected transmitter branch 1102 having a selective switch 1103 adaptable to select between the transmit paths AF1 and BF1, a corresponding transmit filter 1112 connected to a circulator 1122. The configuration may further comprise a separate protected receiver branch 1104 having a selective switch 1113 adaptable to select between the receive paths AF1 and BF1, a corresponding receive filter 1114 connected to a respective circulator 1124 wherein the circulators 1122, 1124 route the appropriate signals to/from antennas 1130, 1140.

Figure 12:
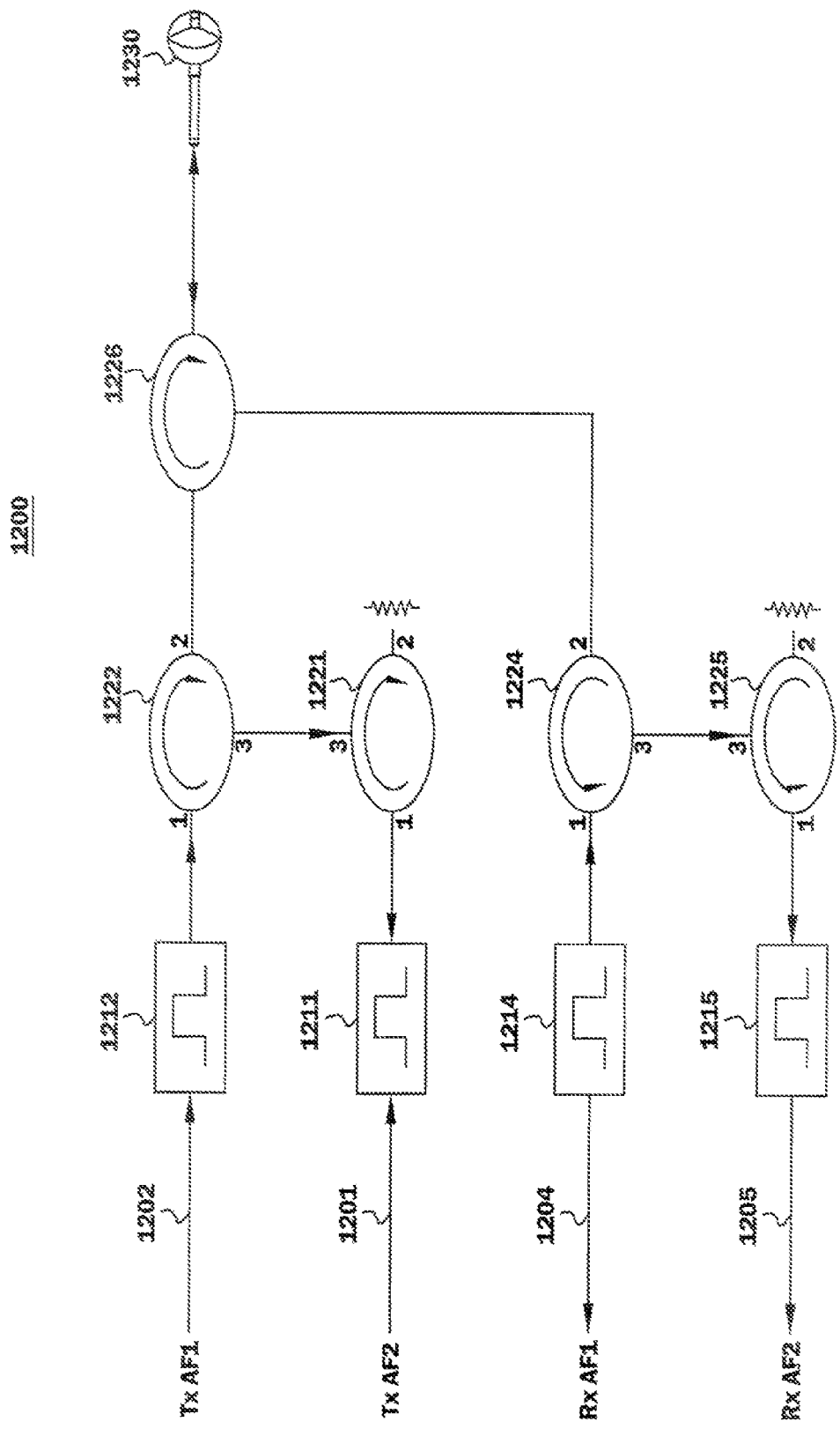

With reference to FIG. 12, a Frequency Diversity Txs and Rxs, Single Antenna (Tx/Tx/Rx/Rx) antenna coupling unit configuration 1200 is illustrated. The configuration may comprise two frequency diversity transmitter branches 1201, 1202 each having a having a corresponding transmit filter 1211, 1212 and each connected to a circulator 1221, 1222 for routing from the appropriate transmit path AF1 and/or AF2. The configuration may further comprise two frequency diversity receiver branches 1204, 1205 each having a corresponding receive filter 1214, 1215 connected to respective circulators 1224, 1225 for routing to the appropriate receive path AF1 and/or AF2. An additional circulator 1226 may be connected to the transmit and receive circulators for routing signals to/from the antenna 1230.

Figure 13:
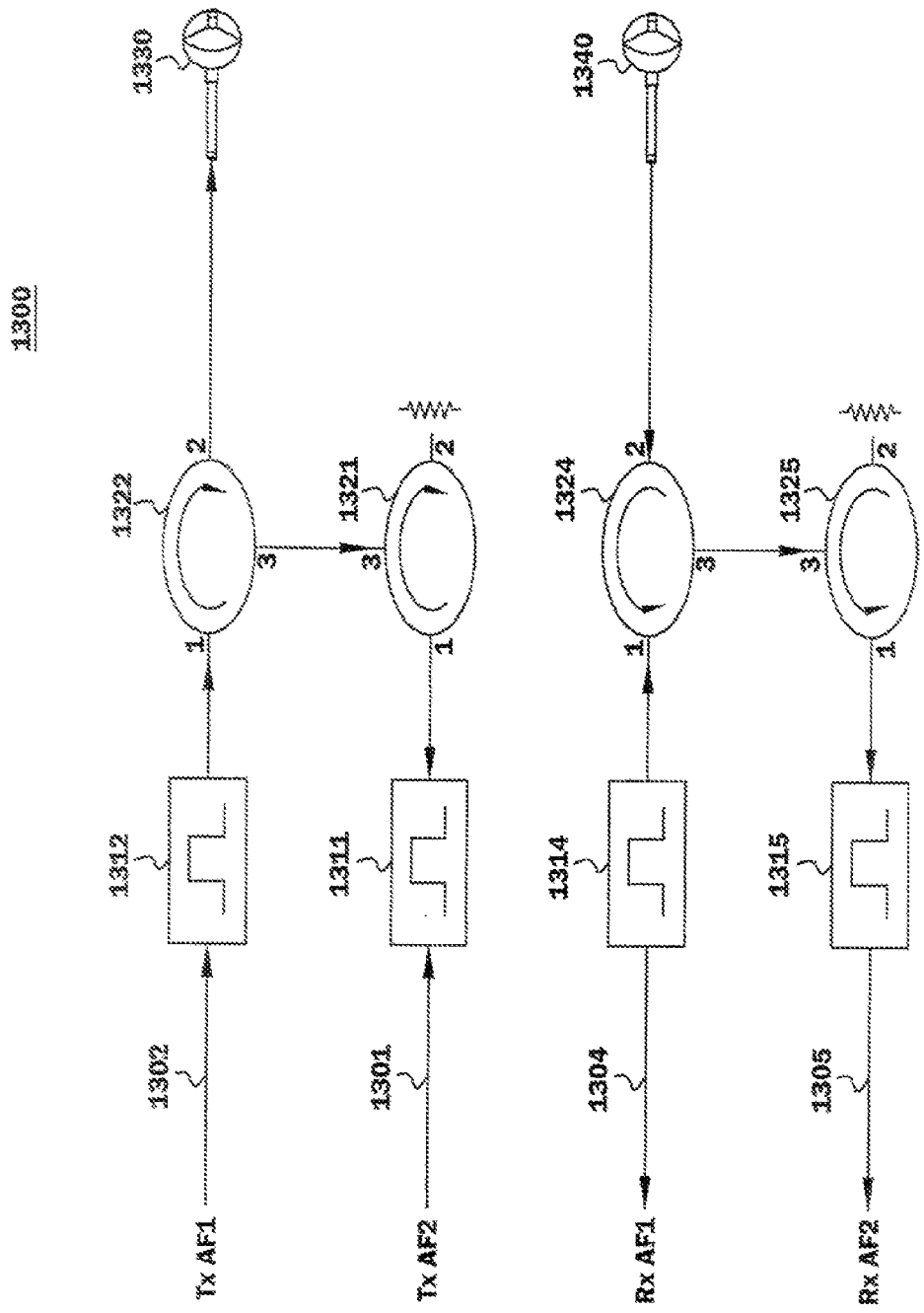

With reference to FIG. 13, a Frequency Diversity Txs and Rxs, Dual Antenna (Tx/Tx, Rx/Rx) antenna coupling unit configuration 1300 is illustrated. The configuration may comprise two frequency diversity transmitter branches 1301, 1302 each having a having a corresponding transmit filter 1311, 1312 and each connected to a circulator 1321, 1322 for routing signals from, the appropriate transmit path AF1 and/or AF2 to the antenna 1330. The configuration may further comprise two frequency diversity receiver branches 1304, 1305 each having a corresponding receive filter 1314, 1315 connected to respective circulators 1324, 1325 for routing signals to the appropriate receive path AF1 and/or AF2 and from the antenna 1340.

Figure 14:
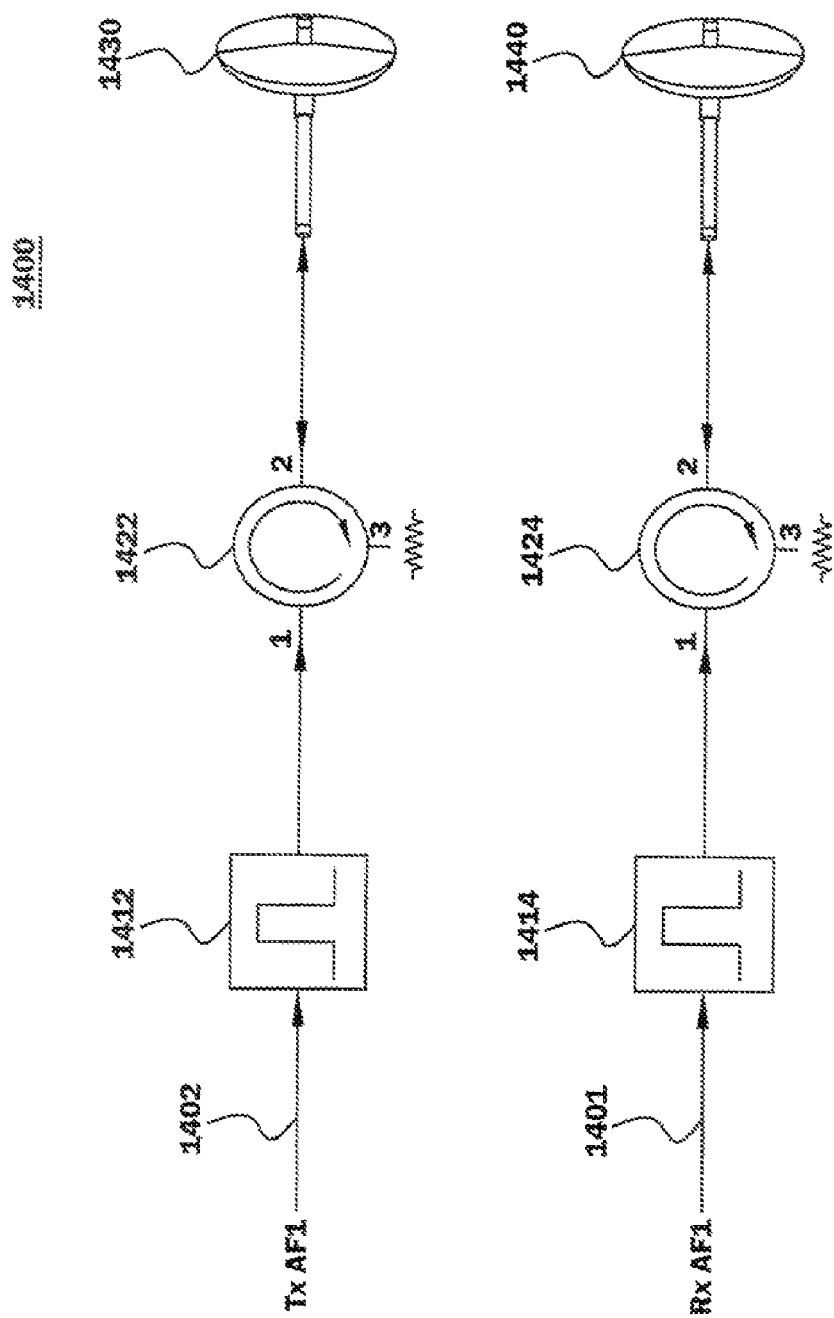

With reference to FIG. 14, a Non-protected Tx and Rx, Separate Antenna (Tx, Rx) antenna coupling unit configuration 1400 is illustrated. The configuration may comprise one non-protected transmitter branch 1402 having a corresponding transmit filter 1412 connected to a circulator 1422 for routing signals to the antenna 1430. The configuration may further comprise one non-protected receiver branch 1404 having a corresponding receive filter 1414 connected to a circulator 1424 for routing signals from the antenna 1440.

Figure 15:
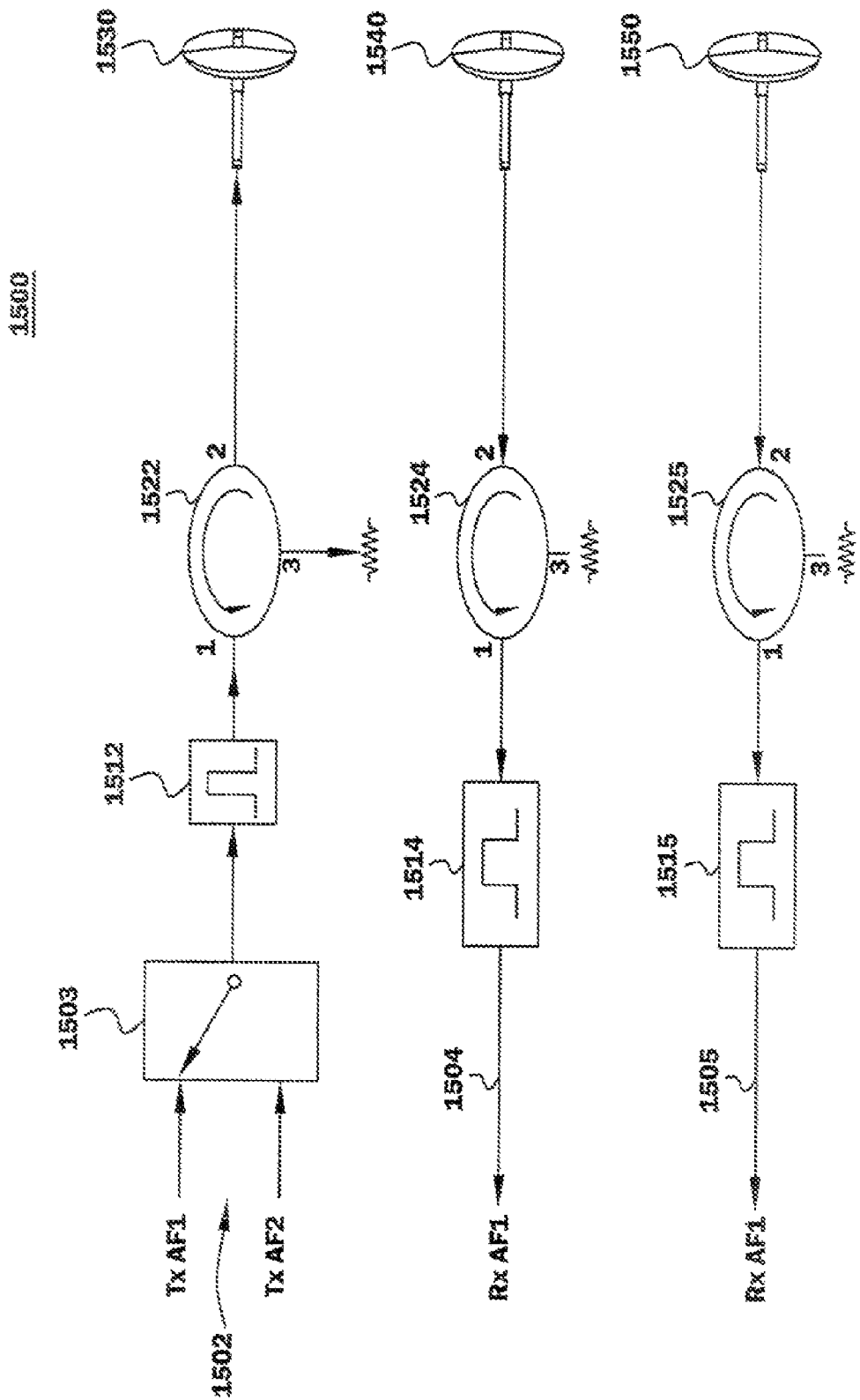

With reference to FIG. 15, a Hot Standby Protected Txs, Space Diversity Rxs, Three Antennas (Tx, Rx, Rx) antenna coupling unit configuration 1500 is illustrated. The configuration may compose one protected transmitter branch 1502 having a selective switch 1503 adaptable to select between the transmit paths AF1 and AF2 and having a corresponding transmit filter 1512 connected to a circulator 1522 for routing signals to the antenna 1530. The configuration may further comprise two space diversity receiver branches 1504, 1505 each having a corresponding receive filter 1514, 1515 connected to respective circulators 1524, 1525 for routing signals from respective antennas 1540, 1550.

Figure 16:
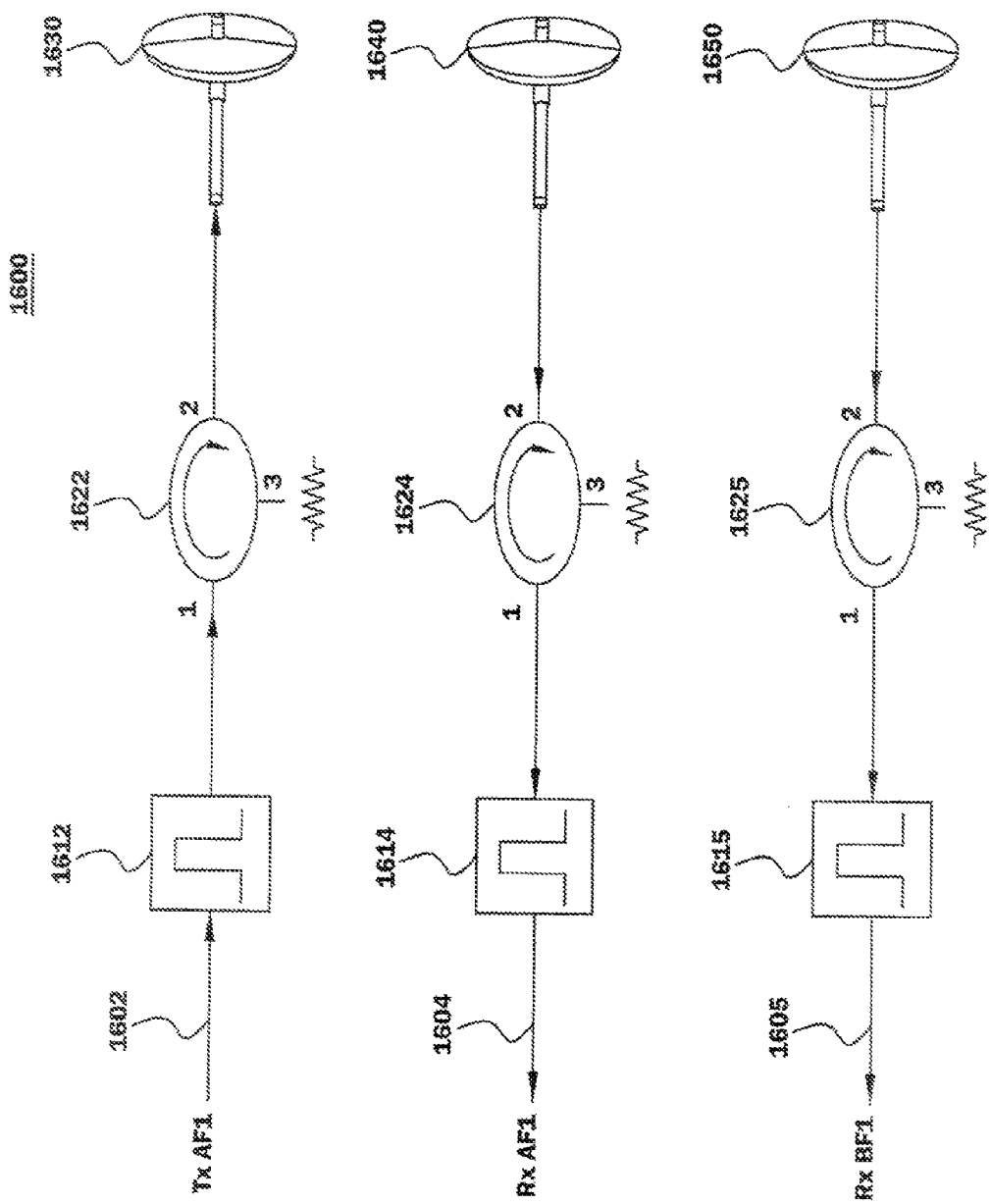

With reference to FIG. 16, a Non-Protected Tx, Space Diversity Rxs, Three Antennas (Tx, Rx, Rx) antenna coupling unit configuration 1600 is illustrated. The configuration may comprise one non-protected transmitter branch 1602 having a corresponding transmit filter 1612 connected to a circulator 1622 for routing signals to the antenna 1630. The configuration may further comprise two space diversity receiver branches 1604, 1605 each having a corresponding receive filter 1614, 1615 connected to respective circulators 1624, 1625 for routing signals from respective antennas 1640, 1650.

Figure 17:
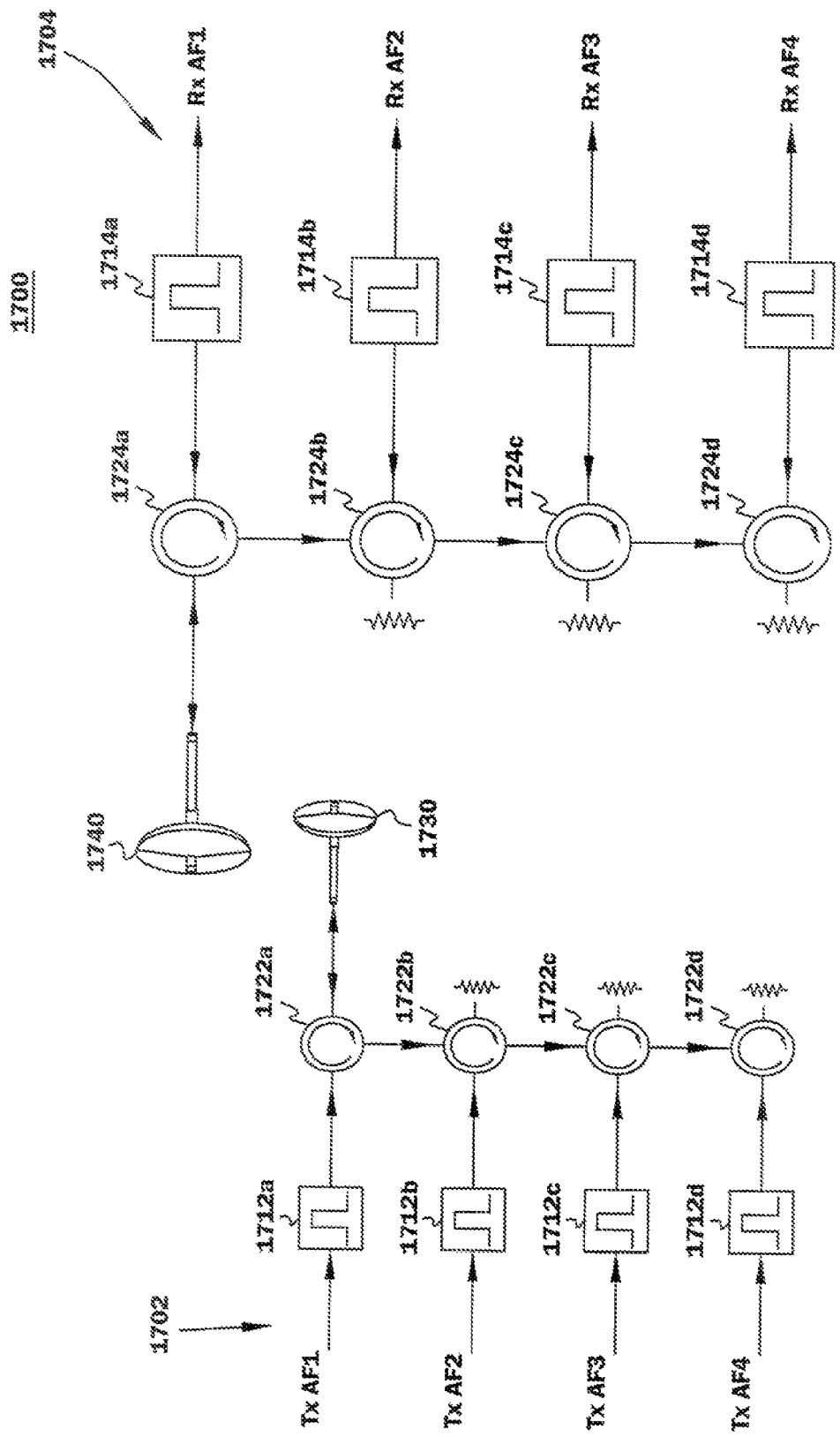

With reference to FIG. 17, a 1:3 Frequency Diversity Txs (Txs, Rxs) antenna coupling unit configuration 1700 is illustrated. The configuration may comprise a 1:3 frequency diversity transmitter branch 1702 having four transmit paths AF1-AF4, four corresponding transmit filters 1712a-d, each connected to respective circulators 1722a-d for routing signals to the antenna 1730. The configuration may further comprise a 1:3 frequency diversity receiver branch 1704 having four receive paths AF1-AF4, four corresponding receive filters 1714a-d, each connected to respective circulators 1724a-d for routing signals from the antenna 1740.

Figure 18:
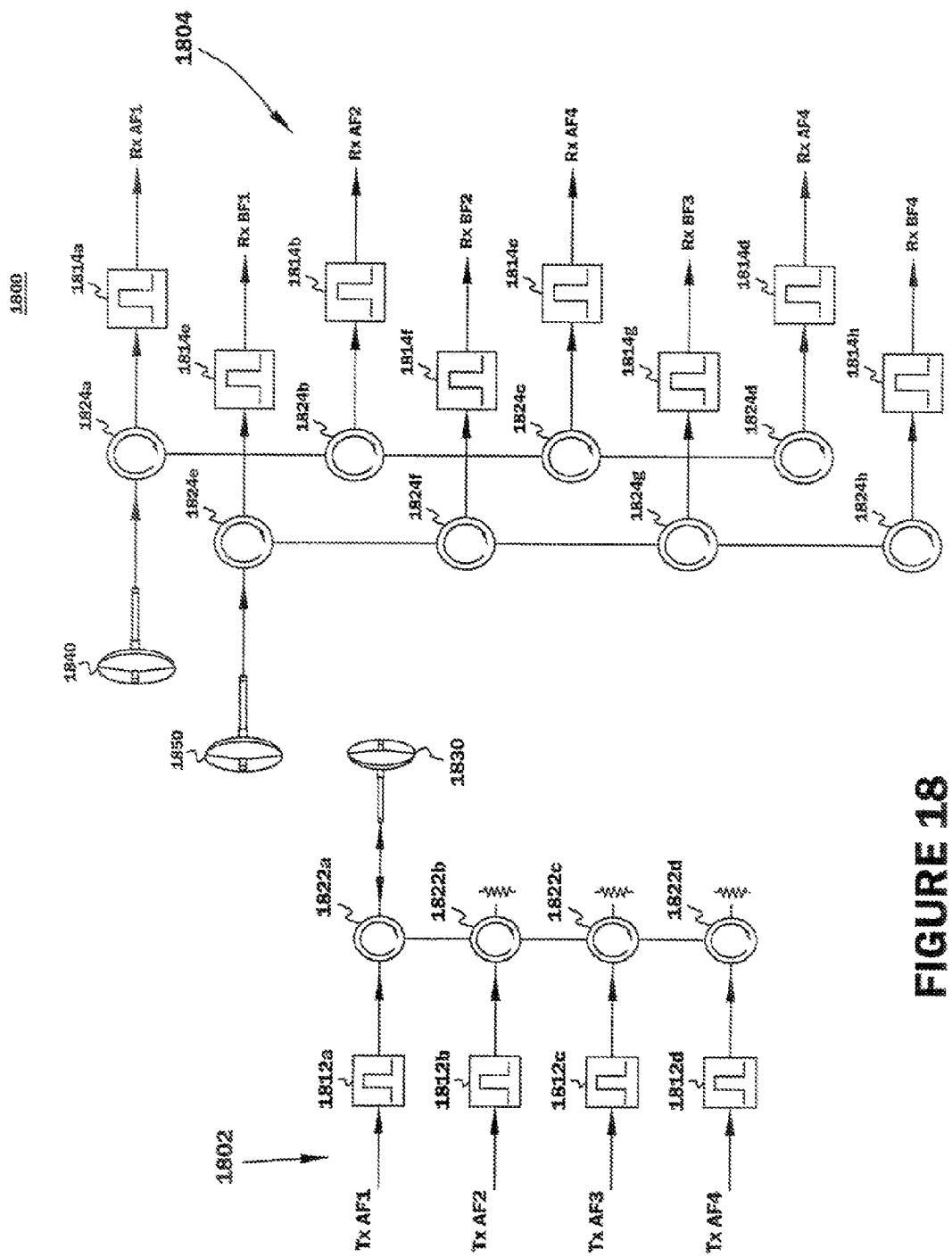

With reference to FIG. 18, a 1:3 Frequency Diversity Txs, Space Diversity Rxs, Three Antennas (Txs, Rxs, Rxs) antenna coupling unit configuration 1800 is illustrated. The configuration may comprise a 1:3 frequency diversity transmitter branch 1802 having four transmit paths AF1-AF4, four corresponding transmit filters 1812a-d, each connected to respective circulators 1822a-d for routing signals to the antenna 1830. The configuration may further comprise a 1:3 space diversity receiver branch 1804 having eight receive paths AF1-AF4 and BF1-BF4, eight corresponding receive filters 1814a-h, each connected to respective circulators 1824a-h for routing signals from the respective antennas 1840, 1850.

The above circulators may be any commonly utilized circulator in the industry for millimeter wave and/or microwave communications systems. Exemplary circulators may be, but are not limited to 3-port "turnstile" or "Y-junction" circulators and may be of the compact stripline variety. Additionally, the above filters may be any commonly utilized filters in the industry for millimeter wave and/or microwave communications systems.

The transmitter aspects of embodiments of the present subject matter are described in further detail in co-pending and related U.S. application Ser. No. 11/750,231, filed May 17, 2007, entitled "Compact Wide Dynamic Range Transmitter For Point To Point Radio," the entirety of which is incorporated herein by reference. The receiver aspects of embodiments of the present subject matter will be further described herein.

Figure 19:
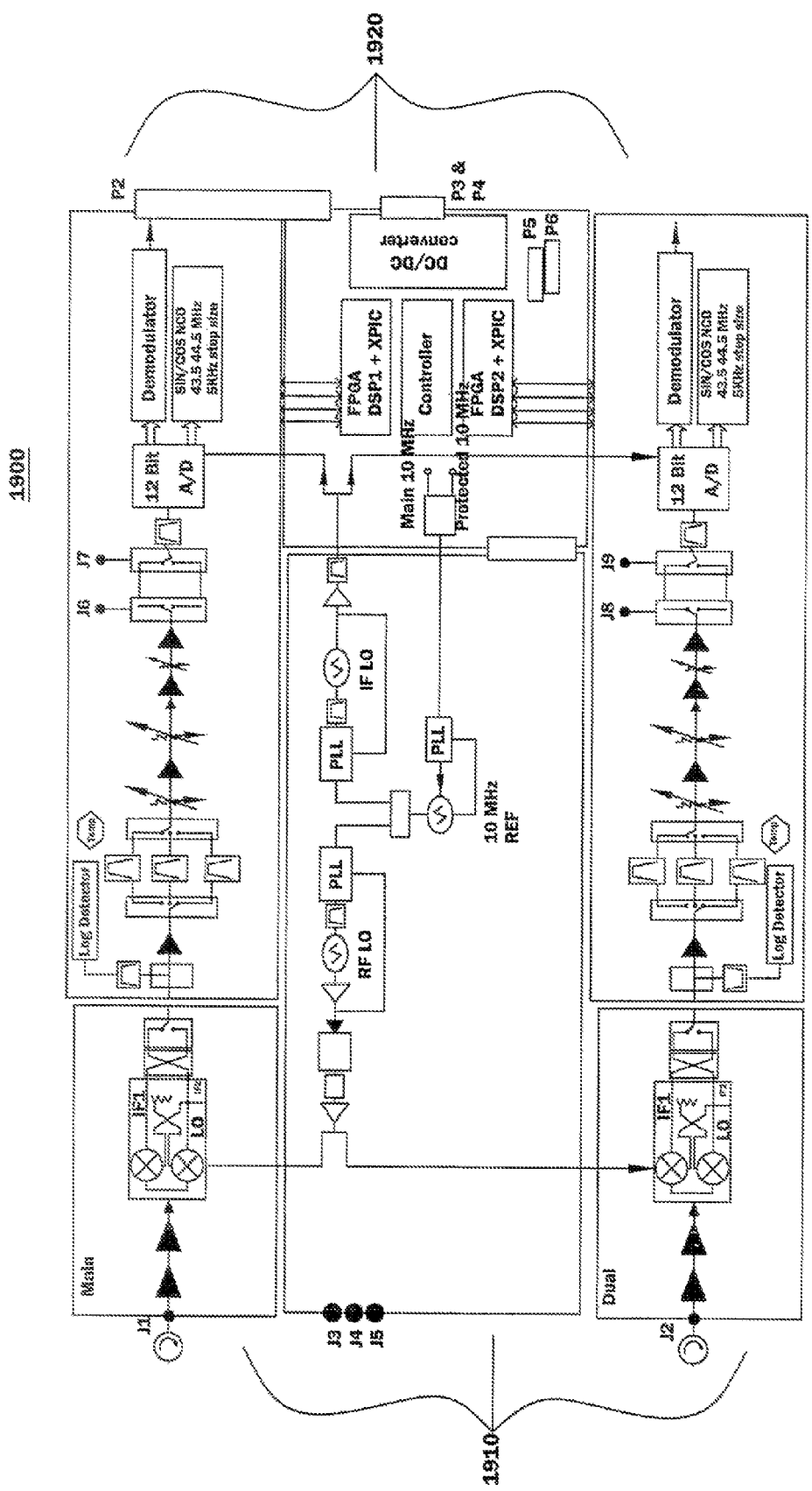
FIG. 19 is a diagram of a receiver according to one embodiment of the present subject matter.

FIG. 19 is a diagram of a receiver according to one embodiment of the present subject matter. With reference to FIG. 19, a receiver 1900 may generally comprise of two boards, an RF board 1910 and an IF board 1920 having plural sections thereof. The receiver 1900 may be optimized for a dual receiver package as shown, may be a single receiver or may also be a dual XPIC receiver. The receiver may operate in a wide frequency range. For example, embodiments may operate with a center frequency of 6 GHz, 7/8 GHz, or 10/11 GHz and the respective frequency range would be 5725 MHz-7125 MHz, 7110 MHz-8500 MHz, and 10500 MHz-11700 MHz; however, such examples should not in any way limit the scope of the claims appended herewith.

Figure 20:
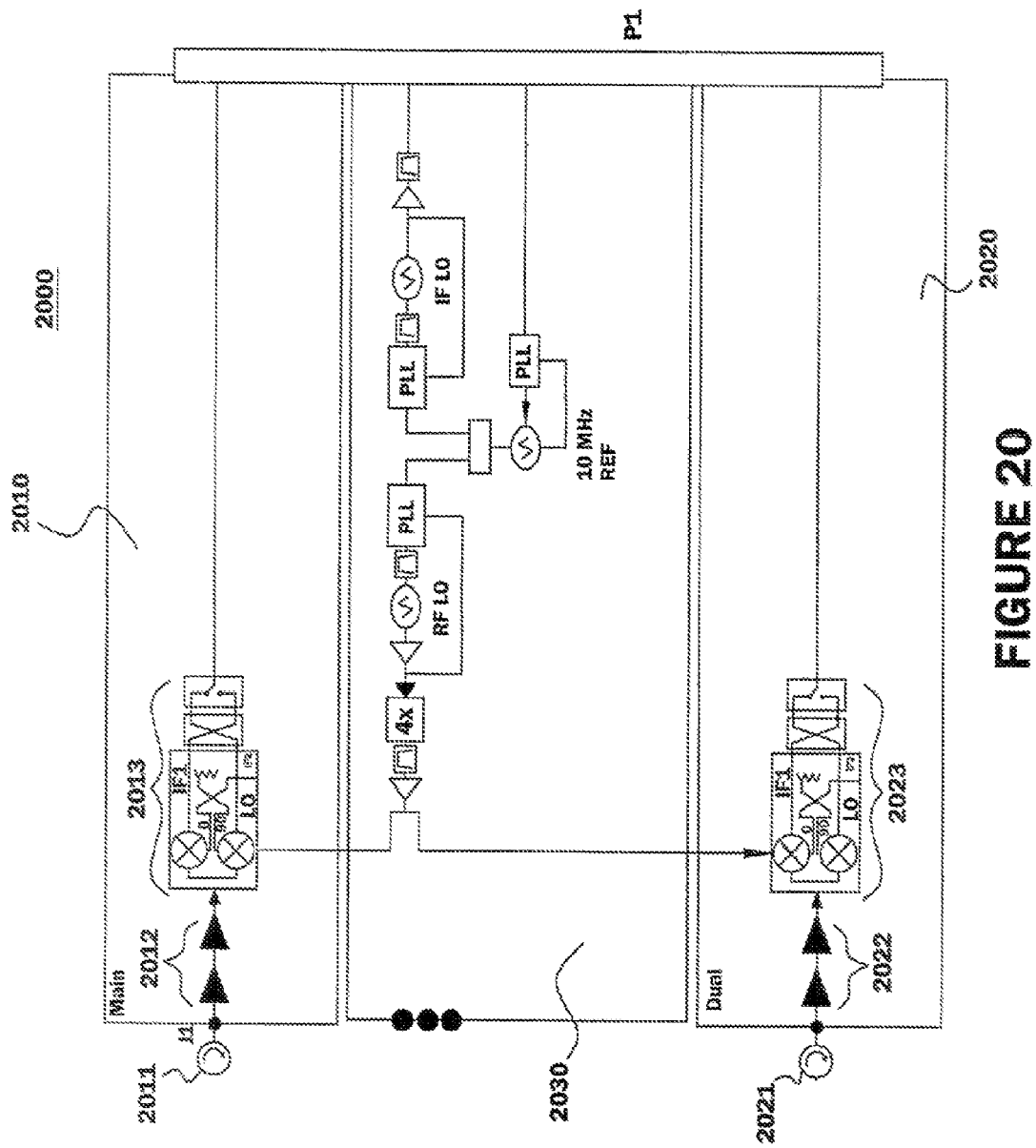
FIG. 20 is a diagram of an RF board according to an embodiment of the present subject matter.

FIG. 20 is a diagram of an RF board according to an embodiment of the present subject matter. With reference to FIG. 20, an RF board 2000 comprises of an main RF front section 2010, a dual RF front section 2020 and a synthesizer section 2030. The selection of the 10 MHz reference signal locates in the IF board (not shown). The RF front sections 2010, 2020 include external circulators 2011, 2021, two-stage low noise amplifiers ("LNA") 2012, 2022, and image rejection mixers 2013, 2023 with a switchable IF output. Table 3 below provides a listing of RF board specifications according to one embodiment of the present subject matter; however, such a listing should not in any way limit the scope of the claims appended herewith.

TABLE 3

| | |
|---|---|
| Input frequency range | 6 GHz: 5725-7125 MHz |
| | 7/8 GHz: 7110-8500 MHz |
| | 10/11 GHz: 10500-11700 MHz |
| Input power range | −16 dBm to −91 dBm |
| Input Return Loss | 17 dB min. |
| Output Frequency Range | 140 MHz +/− 20 MHz |
| Gain Range | 22-32 dB |
| Output Return Loss | 14 dB min. |
| RF LO Frequency Range | 6 GHz: 5863-6560 MHz (LSB) |
| | 6 GHz: 6280-6985 MHz (USB) |
| | 7/8 GHz: 7250-7940 MHz (LSB) |
| | 7/8 GHz: 7660-8360 MHz (USB) |
| | 10/11 GHz: 10640-11240 MHz (LSB) |
| | 10/11 GHz: 10960-11560 MHz (USB) |
| RF LO Power Level (internal) | 15 dBm +/− 3 dB |
| RF LO Return Loss (internal) | 10 dB min. |
| Noise Figure | 6/7/8 GHz: 2 dB typical, 2.5 dB max. |
| | 10/11 GHz: 2.3 dB typical, 2.8 dB max. |
| Input IM3 | −32 dBc max. @ 19 dBm |
| | each tone at input |
| Overload | No damage @ 0 dBm input |
| In-Band Flatness | +/−0.5 dB within any 40 MHz |
| | bandwidth |
| Spurious @−15 dBm total input | −60 dBc max. within +/...20 MHz and |
| | @ +/−120 to 160 MHz offset |
| DC Suppliers | +12 V, +6 V, −6 V |

Thus, embodiments of the present subject matter through the single down conversion combined with the image rejection mixer and switchable sideband selection may provide a simple overall design, low cost, and reduced bandwidth requirement for the synthesizer. For example, supporting the same bandwidth for 6 GHz (5.725-7.125 GHz), and using the same single down conversion and image rejection approach, a switchable approach according to an embodiment of the present subject matter may reduce the LO bandwidth requirement from 30.3% to 17.4%.

Figure 21:
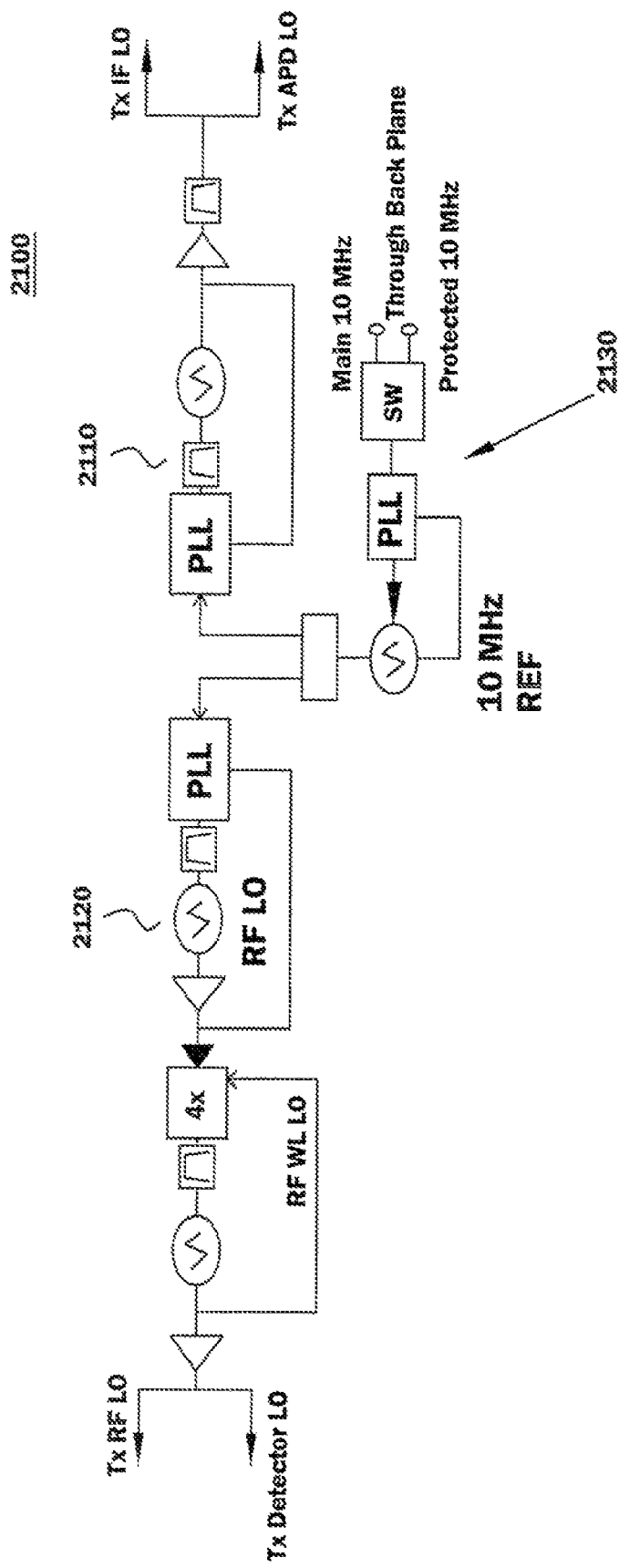
FIG. 21 is a diagram of a synthesizer section according to an embodiment of the present subject matter.

FIG. 21 is a diagram of a synthesizer section according to an embodiment of the present subject matter. With reference to FIG. 21, the synthesizer section 2100 is a portion of the entire receiver front board. There are two synthesizers with one shared reference, Rx IF local oscillator ("LO") 2110 and Rx RF LO 2120. The local reference 2130 (e.g., a voltage controlled-temperature compensated crystal oscillator ("VC-TCXO")) may also be phase locked with another common TCXO reference in a data processing unit ("DPU") (not shown) through the backplane. The TXCO reference may be the common reference for all transmitters and receivers within the entire radio shelf (e.g., for 4 transmitters and 4 dual receivers, etc.). For certain frequency bands, because of the bandwidth requirement, there is a need to utilize multiple RF voltage controlled oscillators (VCO) to be switched to cover the entire bandwidth. Thus, embodiments of the present subject matter may provide receiver architecture utilizing a combination of the coarse tune of the RF LO and the fine tune of the numerically controlled oscillator ("NCO") in an FPGA (not shown). Since the NCO is a digital programmable oscillator, the phase noise requirement may be reduced thus allowing usage of a wide loop bandwidth synthesizer to enhance system robustness against vibrations and eliminating the need for expensive cabling and shock absorbing mounts.

For protection purposes, there may also be another protection DPU. For hitless purposes, when reference changing from the main DPU to the protected DPU, there are no error or synchronization losses during switching. Protection switching aspects of embodiments of the present matter are described in co-pending and related U.S. application Ser. No. 11/655,837, filed Jan. 22, 2007, entitled Distribution Protection Switching Architecture for Point-to-Point Microwave Radio Systems," the entirety of which is incorporated herein by reference. Further, in the synthesizer section 2110, there may be auto hardware sensing circuitry (not shown) that provides the necessary switching for any reference signals. Thus, this architecture provides a coherent and hitless receiver architecture by providing two common references from the DPUs that go through the backplane to the receiver modules. All the sources within the same receiver may share this common reference and all of the receivers within the same shelf may also share this reference. In addition to a common reference for all the sources and all receivers, such an architecture may provide a hitless switching capability when one reference fails and is switched to the second reference. The common reference also provides the capability of future multiple input multiple output ("MIMO") and receiver coherent features. Table 4 below provides a listing of Rx Synthesizer specifications according to one embodiment of the present subject matter; however, such a listing should not in any way limit the scope of the claims appended herewith.

TABLE 4

| | |
|---|---|
| Rx IF LO Frequency Range | 6 GHz: 184 MHz |
| | 7/8 GHz: 184 MHz |
| | 10/11 GHz: 184 MHz |
| Rx IF LO step size | Fixed |
| Rx IF LO Tuning Bandwidth | Fixed |
| Rx IF LO phase noise | −100 dBc/Hz @ 10 K offset |
| Rx RF LO Frequency Range | 6 GHz: 5865-6560 MHz (LSB) |
| | 6 GHz: 6280-6985 MHz (USB) |
| | 7/8 GHz: 7250-7940 MHz (LSB) |
| | 7/8 GHz: 7660-8360 MHz (USB) |
| | 10/11 GHz: 10640-11240 MHz (LSB) |
| | 10/11 GHz: 10960-11560 MHz (USB) |
| Rx RF LO Multiplicication | 6 GHz: 4 |
| | 7/8 GHz: 4 |
| | 10/11 GHz: 4 |
| Rx RF LO step size | 6 GHz: 1 MHz |
| | 7/8 GHz: 1 MHz |
| | 10/11 GHz: 1 MHz |
| Rx RF LO phase noise | IPN 25 KHz to 1 MHz: −41.45 |
| | dBc/0.48 deg. (32 QAM) |
| | IPN 75 KHz to 5 MHz: −44.44 |
| | dBc/0.34 deg. (64 QAM) |
| | IPN 40 KHz to 2 MHz: −47.61 |
| | dBc/0.24 deg. (128 QAM) |
| | IPN 250 KHz to 10 MHz: −50.49 |
| | dBc/0.17 deg. (256 QAM) |
| Rx RF VCO Frequency Range | 6 GHz: 1466-1640 MHz (LSB) |
| | 6 GHz: 1570-1747 MHz (USB) |
| | 7/8 GHz: 1812-1985 MHz (LSB) |

TABLE 4-continued

| | |
|---|---|
| | 7/8 GHz: 1915-2090 MHz (USB) |
| | 10/11 GHz: 2660-2810 MHz (LSB) |
| | 10/11 GHz: 2740-2890 MHz (USB) |
| Rx RF VCO step size | 6 GHz: 250 KHz |
| | 7/8 GHz: 250 KHz |
| | 10/11 GHz: 250 KHz |
| Phase hit for frequency jump | 7 KHz max. |
| Rx RF LO harmonics | −25 dBc min. |
| Rx RF LO sub-harmonics | −35 dBc min. |
| Rx LO Spurious | −45 dBc min. +/−10 KHz to 1 MHz |
| | −65 dBc min. +/−1 MHz to 100 MHz |
| | −90 dBc min. at 120-160 MHz offset |
| Local reference | Frequency: 10 MHz |
| | Stability: +/−5 ppm including 5 years aging and temperature variation |

Figure 22:
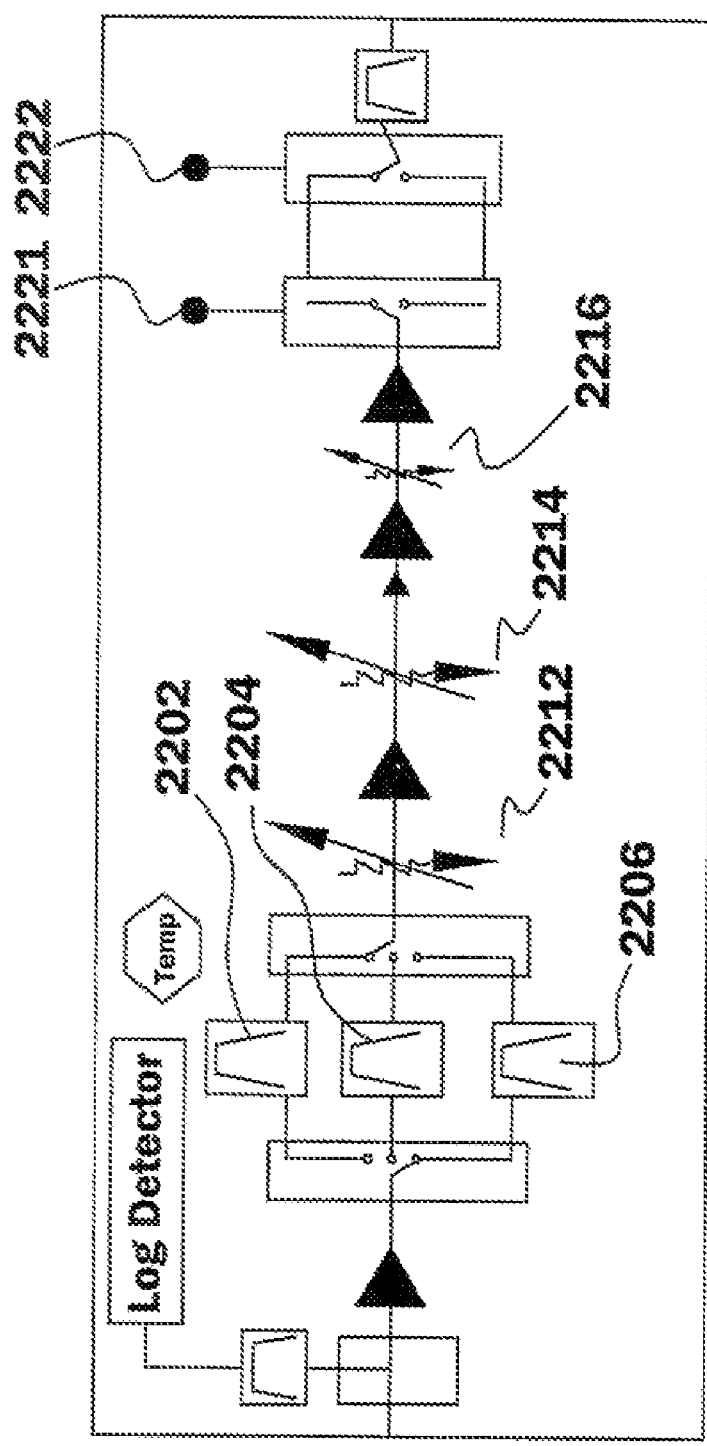
FIG. 22 is a diagram of an Rx IF section according to an embodiment of the present subject matter.

The IF board generally includes an Rx IF section, an Rx received signal strength indication ("RSSI") section, an Rx waveform processing section, a DC_DC converter section and a microprocessor section. FIG. 22 is a diagram of an Rx IF section 2200 according to an embodiment of the present subject matter. With reference to FIG. 22, the Rx IF section 2200 accepts a 140 MHz signal from the respective Rx front section 2010, 2020 and provides automatic gain control ("AGC") circuitry for the demodulator (not shown). The Rx IF section 2200 also provides two test ports 2221, 2222 allowing an injection of an IF fading signal for DFM testing. To achieve overall system threshold-to-interference ("T/I") requirements, three Rx IF filters 2202, 2204, 2206 may be provided for switching purposes when the channel bandwidth changes. Analog attenuators 2212, 2214, 2216 may also be provided for reducing the power level of the signal with little or no reflection.

Traditional AGC loops utilize an IF detector with a very narrow band filter in the AGC detector path to close loop with a number of analog attenuators; however, due to the modulation/capacity independent radio requirements, the same receiver must support both a narrow bandwidth signal and wide bandwidth signal to avoid interference in the AGC loop. However, in receiver architectures according to embodiments of the present subject matter, due to co-location of RF/IF and demodulator circuitry, the receiver may employ a digital detector in the FPGA (not shown) directly. Additionally, since there is a programmable baseband low pass filter already before the digital detector, any interference has been rejected already. Because of the FPGA approach, the AGC loop offers programmable multi-feedback signals instead of traditional single AGC signal to close loop with a number of analog attenuators thus greatly simplifying the overall AGC circuitry and providing the sequence for each attenuator depending upon receiver signal level, fast AGC speed, etc. Table 5 below provides a listing of Rx IF section specifications according to one embodiment of the present subject matter; however, such a listing should not in any way limit the scope of the claims appended herewith.

TABLE 5

| | |
|---|---|
| Input Frequency Range | 140 MHz +/− 20 MHz |
| Input Power Range | 18 dBm to −64 dBm |
| Input Return Loss | 14 dB min. |
| Output Frequency Range (internal) | 140 MHz +/− 20 MHz |
| Output Power Level (internal) | −19 dBm +/− 1 dB |
| Output Return Loss (internal) | 14 dB min. |
| Noise Figure | 16 dB max. |
| Input IM3 | −48 dBc max. @ 14.5 dBm each tone at input with AGC of −19 dBm |
| Overload | No damage @ 33 dBm input |

TABLE 5-continued

| | |
|---|---|
| In-Band Flatness | +/−0.5 dB within any 40 MHz bandwidth |
| Spurious at any valid input level range | −75 dBc max, within +/−20 MHz |
| RFU Group Delay within 1 dB bandwidth | 45 MHz: <25 ns |
| | 12 MHz: <35 ns |
| RF amplitude flatness response (IF Filter BW option) | 45 MHz: <=1 dB; rejection 12 dB min. @ +/−40 MHz offset |
| | 12 MHz: <=1 dB; rejection 12 dB min. @ +/−20 MHz offset |
| | 5 MHz: <=1 dB; rejection 12 dB min. @ +/−10 MHz offset |
| Analog Attenuator Dynamic Range | AR1: 25 dB min. |
| | AR2: 30 dB min. |
| | AR3: 30 dB min. |
| AGC Speed | 100 dB/s min. |

Figure 23:
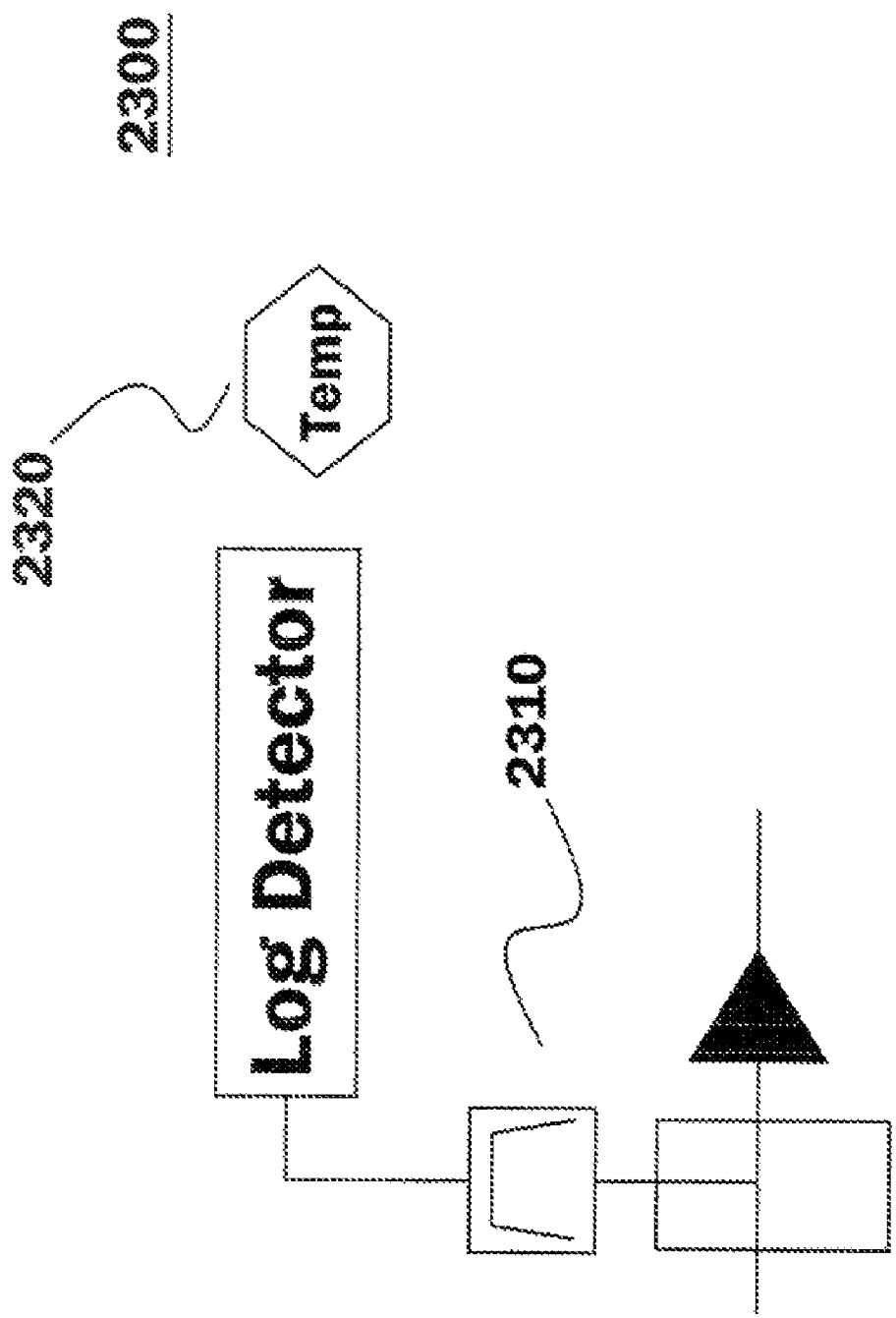
FIG. 23 is a diagram of an Rx RSSI section according to an embodiment of the present subject matter.

FIG. 23 is a diagram of an Rx RSSI section 2300 according to an embodiment of the present subject matter. With reference to FIG. 23, the Rx RSSI section 2300 receives a coupled signal from the respective RF front section 2010, 2020 and passes the signal through a narrow band SAW filter 2310 with a predetermined bandwidth, in the RSSI section 2300, a temperature sensor 2320 may be provided that is utilized as the overall receiver temperature and provides an input signal to the microprocessor (not shown). Table 6 below provides a listing of Rx RSSI section specifications according to one embodiment of the present subject matter; however, such a listing should not in any way limit the scope of the claims appended herewith.

TABLE 6

| | |
|---|---|
| Input Frequency | 140 MHz |
| Frequency BW | 4 MHz |
| Input Power Level | 14 to −62 dBm |
| RSSI Voltage Range | 0-5 V |

Figure 24:
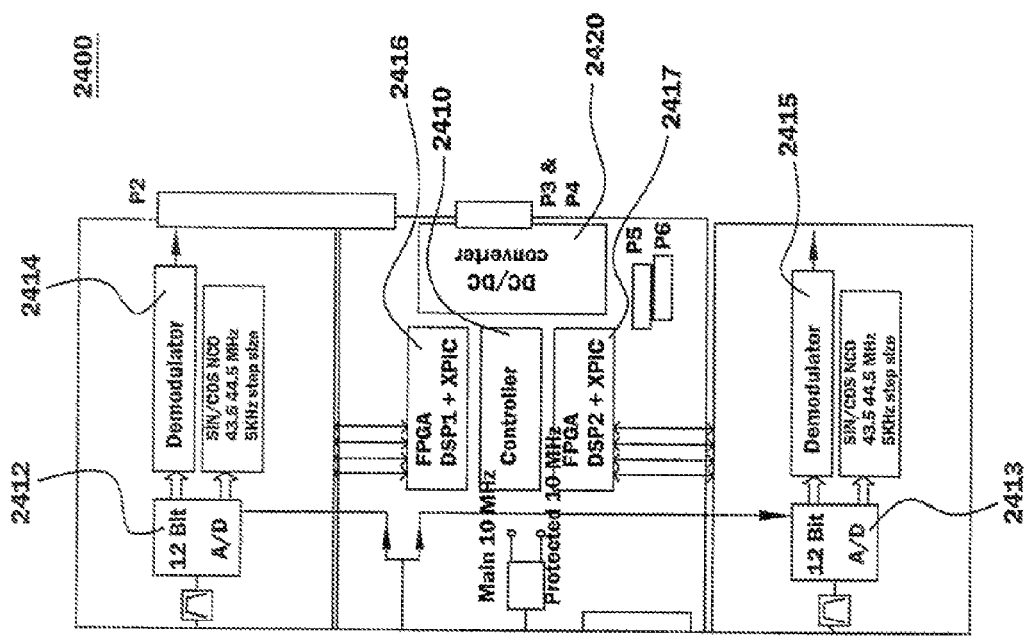
FIG. 24 is a diagram of an Rx Waveform Processing section according to an embodiment of the present subject matter.

FIG. 24 is a diagram of an Rx Waveform Processing section 2400 according to an embodiment of the present subject matter. With reference to FIG. 24, the Rx Waveform Processing section 2400 provides a plurality of functions. First, the section 2400 may provide automatic gain control. For example, the receiver level may be controlled by a controller 2410 that measures the total analog to digital power. The AGC function may also include both digital compensation and digitally-controlled analog compensation. To meet T/I specifications, analog filtering should be combined with digital attenuation. The analog compensation may also be controlled to set the total power (i.e., signal+interference) into the ADCs 2412, 2413 at 10 dB below full scale. The digital and analog compensation may also be capable of tracking the fading signal at a rate of 100 dB/s. Thus, several RF attenuators may be controlled in a manner that preserves the signal-to-noise ratio and dynamic range of the receiver while tracking fades. The dynamics of each attenuator control may also be set independently.

The Waveform Processing section 2400 also demodulates an input signal provided by the Rx IF section. The 140 MHz IF signal may be digitally downconverted, decimated and resampled. A demodulator 2414, 2415 may implement digital filtering to meet the T/I specifications with minimal analog filtering. The ADCs 2412, 2413 should be 12 bits for improved dynamic range in the presence of interferers. Embodiments of the demodulator 2414, 2415 may also implement a simplified sampling clock that is the same frequency for all baud rates and modulations. An exemplary frequency may be, but is not limited to, 186.666 MHz. To preserve the capability of the ADC, the associated integrated RMS phase jitter (10 kHZ-200 MHz) may be less than 0.64 ps (10 kHz to 200 MHz offset), thus suggesting a VCXO or high performance DDS implementation in alternative embodiments of the present subject matter. The demodulator 2414, 2415 may be generally co-located with the RF/IF circuitry described above. Co-locating the RF/IF and demodulator circuitry simplifies the overall receiver design, saves component count, minimizes the overall degradation, and makes a digital AGC loop architecture possible. Further, by sampling directly the 140 MHz IF signal at the ADC, the demodulator 2414, 2415 reduces the number of conversion stages required in the IF chain. Additionally, the demodulator 2414, 2415 provides good T/I performance. In embodiments of the present subject matter, a large portion of interference is removed or suppressed in the FPGA by digital filtering. The main signal at the input of the 12 bit ADC possess significant back off from the ADC maximum input level so that the interference does not saturate the ADC.

For embodiments employing XPIC, the sampling clock may be phase-locked to the RF frequency reference distributed from the DPUs. The allowable carrier frequency offset may be 110 kHz (2*5 ppm at 11 GHz). The demodulator 2414, 2415 should also track a step phase hit of 7 kHz without error and the average system recovery time (carrier and frame recovery) should be less than 45 ms for capacity less than 3DS3 and less than 15 ms for capacity greater than or equal to 3DS3. In an alternative embodiment, shelf timing may be extracted from an airlink baud clock. In such embodiments, the timing recovery loop should possess less than 0.1 dB peaking in the response. The baud clock may be divided down to 8 kHz and distributed to the DPUs via low voltage differential signaling ("LVDS") over the backplane. Embodiments of the demodulator 2414, 2415 may also report synchronization loss, low signal and signal degrade alarms to a controller, microprocessor, and/or FPGA. The baud timing may then be extracted and delivered to the DPU for use as a shelf timing reference. Carrier tracking and channel equalization may also be performed.

In an additional embodiment, XPIC may be implemented where paired Rx RF units may exchange A/D samples utilizing dual 1.5 Gb data streams. In embodiments utilizing XPIC, the A/D sample clock should be locked to the shelf RF reference from the DPUs. Further, transitions between the primary and secondary references should not cause more than a 1 ps cycle-cycle edge jitter on the A/D sample clock. Generally a link of approximately 2.4 Gbps may be required between XPIC pairs in each direction across the backplane to carry 200 MSPS at 12 bits. This link may be implemented as two 1.2 Gbps links encoded with 8 b/10 b. Data may then be sent in roughly 1000 byte blocks with a periodic frame synchronization (K-character) followed by the number of bytes in the packet.

The Waveform Processing section 2400 may also provide forward error correcting ("FEC"). For example, Reed-Solomon ("RS"), 2D-Trellis Coded Modulation ("TCM") and 4D-TCM may be provided with migration to low density parity check ("LDPC") codes or a suitable next generation code. A TCM decoder compatible with an encoder may be implemented to decode 2D or 4D schemes at the symbol level. A block or convolutional interleaver may also be provided as necessary. A convolutional deinterleaver with programmable rows and delay may also be implemented when TCM is utilized with latency-sensitive applications. In embodiments of the present subject matter, the data payload may be descrambled. For example, the seed may be manually reset after a programmable number of blocks. An RS block decoder may be implemented with a block size from 150-255 bytes, T=3 to 10. One embodiment of the RS decoder may alternatively handle smaller blocks with zero stuffing and accept non-streaming data such as burst mode. To improve latency for lower data rates, the circuitry following the syndrome calculation may operate on a block basis rather than a streaming basis, and framing overhead may also be extracted.

The Waveform Processing section 2400 may also provide airlink deformatting. Embodiments of the present subject matter may transport various of airlink containers over an airlink. For example, AU3, AU4, STS-3, NxVT1.5, 1-3xSTS-1, 1-4xDS3, NxEthernet over VT1.5, and 28DS1/DS3 are exemplary airlink containers; however, such examples should not in any way limit the scope of the claims appended herewith. These airlink containers may require decompression and may be extracted from the FEC blocks. For example, framing information may be extracted from the airlink and utilized to buffer the bytes according to the appropriate airlink traffic type. Compressed airlink traffic may also be decompressed and passed to a data framer.

The Waveform Processing section 2400 may also frame and distribute data to the primary and second DPUs. Traffic may be provided to redundant DPUs over SONET framed 1.5 Gb links. Reliability information may be included to enable hardware-control led diversity and 1:N protection. The service channel data may be packaged into a separate backplane container. Further, all airlink data pay load may be framed into an STS-24 stream along with the service channel container. Traffic types which may be received and passed through to the DPU may be, but are not limited to, AU3, AU4, STS-1, DS3, Ethernet over VT1.5, and VT1.5. The link states for these containers may also be collected and reported to the main controller 2410.

The main controller 2410 may be one, plural or a combination of microcontroller, microprocessor, FPGA or other suitable devices. The controller 2410 may receive a plurality of digital, RF and/or analog inputs such as, but not limited to Rx temperature signals, Rx RF PLL signals, Rx 10Ref PLL signals, Clock recovery signals, XPIC signals, sample clock signals, Rx RF VCO signals, Rx IF filter signals, TCXO selection and alarm signals, RSSI filter and voltage signals, analog attenuator signals; however, such examples should not in any way limit the scope of the claims appended herewith. The controller 2410 may also be utilized to poll for alarms from various components of the receiver and/or transmitter and report the alarms to a signal processing unit ("SPU") (not shown). The controller may set frequency, output power, mute function of the receiver and/or transmitter according to a radio command and may also control the receiver through switch settings. The controller may report receiver status such as RSSI and receiver temperature. Further, the controller may provide communication with transmitter modules utilizing local receiver USB ports to communicate through external RF monitor software and/or utilizing the SPU through the backplane to communicate via embedded firmware. The Waveform Processing section 2400 may also comprise a DC-DC converter section 2420. The DC-DC converter 2420 generally provides appropriate DC power to various components in the receiver architecture.

One aspect of the present subject matter provides a unique simple calibration procedure. With the above-mentioned unique AGC loop capability, plus using the 10 bits PWM D/As, requirements for calibration are greatly enhanced. To avoid inaccuracies because of potential interference, the RSSI utilizes a narrow band SAW filter to reject any interference and then utilizes modulation/capacity correction to maintain overall system accuracy requirements. This correction factor, when applied to compensate for different bandwidth signals, may be stored in the receiver EEPROM or other database (not shown). Such a factor may also be determined during the calibration phase. This calibration accounts for possible filter center frequency and bandwidth variations from unit to unit. The correction factor is a fine tune of the standard compensation loaded in the radio setting files (e.g., part of the RF Unit embedded software). The calibration may also employ continuous wave ("CW") signals and store the log detector reading at periodic intervals due to the linearity of the detector.

Thus, one embodiment of the present subject matter provides a radio frequency receiver comprising a receiver module which receives an RF signal and provides a baseband I signal and a baseband Q signal, eliminates a sideband of the I signal and a sideband of the Q signal to create a first and a second signal, downconverts the first and second signal to a first and a second IF, and selects one of the first or second IF signals. The receiver also comprises an IF module which receives the first or second IF signal, performs analog-to-digital conversion on the first or second IF signal, and demodulates the digitally converted IF signal. The receiver further comprises a synthesizer module which receives a programmable reference signal, downconverts the reference signal to an IF feedback signal, downconverts the reference signal to a baseband feedback signal, provides the IF feedback signal to the IF module, and provides the baseband feedback signal to the receiver module. The receiver also includes a controller module which samples the digitally converted IF signal and provides the programmable reference signal to the synthesizer module to thereby provide a demodulated output signal. An alternative embodiment of the present subject matter may also include a digital detector in the controller module such as a FPGA. Further embodiments of the present subject matter may include a temperature compensation module such as a temperature sensor located in proximity to the IF module.

An additional embodiment of the present subject matter provides a radio frequency receiver system comprising an electronics rack having an electrical backplane, a plurality of RF receivers each operatively connected to the backplane, and a DPU operatively connected to the backplane, the DPU having a first and a second common reference signal generator. Each receiver may comprise a receiver module which receives an RF signal and provides a baseband I signal and a baseband Q signal, eliminates a sideband of the I signal and a sideband of the Q signal to create a first and a second signal, downconverts the first and second signal to a first and a second IF signal, and selects one of the first or second IF signals. Each receiver may further comprise an IF module which receives the first or second IF signal, performs analog-to-digital conversion, on the first or second IF signal, and demodulates the digitally converted IF signal. Each receiver may also comprise a synthesizer module which receives a programmable reference signal, downconverts the reference signal to an IF feedback signal, downconverts the reference signal to a baseband feedback signal, provides the IF feedback signal to the IF module, and provides the baseband feedback signal to the receiver module. Each receiver may include a programmable reference signal generator which samples the digitally converted IF signal and provides the programmable reference signal to the synthesizer module to thereby provide a demodulated output signal, and may include a frequency locking circuit. In one embodiment of the present subject matter each of the common reference generators may be switchably connected to the programmable reference signal generator via the frequency locking circuit. In an additional embodiment of the present subject matter the DPU may further comprise a second switch adaptable to switch from a first of the plural receivers to a second of the plural receivers. This switching may occur as a result of an error or failure in the first receiver or may occur as a function of a quality measurement of the RF or IF signal. Exemplary quality measurements may comprise, but are not limited to signal strength, signal to noise ratio, bit error rate, and received power level. An alternative embodiment of the present subject matter may include a controller module that further comprise a digital detector such as an FPGA. A further embodiment may also comprise a temperature compensation module including a temperature sensor located in proximity to the IF module.

As shown by the various configurations and embodiments illustrated in FIGS. 1-24, a system, method and apparatus for a radio frequency receiver have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What we claim is:

1. A radio frequency receiver comprising:
a receiver module which receives a radio frequency ("RF") signal and provides a baseband in-phase ("I") signal and a baseband quadrature ("Q") signal, eliminates a sideband of said I signal and a sideband of said Q signal to create a first and a second signal, downconverts said first and second signal to a first and a second intermediate frequency ("IF") signal, and selects one of said first or second IF signals;
an IF module which receives said first or second IF signal, performs analog-to-digital conversion on said first or second IF signal, and demodulates said digitally converted IF signal;
a synthesizer module which receives a programmable reference signal, downconverts said reference signal to an IF feedback signal, downconverts said reference signal to a baseband feedback signal, provides said IF feedback signal to said IF module, and provides said baseband feedback signal to said receiver module;
a controller module comprising an integrated circuit configured to sample said digitally converted IF signal, said integrated circuit comprising a numerically controlled oscillator configured to provide said programmable reference signal to said synthesizer module; and
a temperature compensation module configured to regulate temperature of said radio frequency receiver based on temperature sensed from said IF module;
said controller module configured to provide a demodulated output signal derived from said digitally converted IF signal.

2. The receiver of claim 1 wherein said integrated circuit comprises a digital detector configured to sample said digitally converted IF signal.

3. The receiver of claim 1 wherein said integrated circuit comprises a field programmable gate array.

4. The receiver of claim 1 wherein said temperature compensation module includes a temperature sensor located in proximity to said IF module.

5. The receiver of claim 1 wherein said receiver is a hitless receiver for a cross polarization interference cancellation ("XPIC") application.

6. The receiver of claim 1 wherein said receiver is a dual port receiver for 1:N space diversity.

7. The receiver of claim 1 wherein said IF module comprises a received signal strength indicator ("RSSI") monitor port.

8. A radio frequency receiver system comprising:
an electronics rack having an electrical backplane;
a plurality of radio frequency ("RF") receivers each operatively connected to said backplane, each receiver comprising:
a receiver module which receives an RF signal and provides a baseband in-phase ("I") signal and a baseband quadrature ("Q") signal, eliminates a sideband of said I signal and a sideband of said Q signal to create a first and a second signal, downconverts said first and second signal to a first and a second intermediate frequency ("IF") signal, and selects one of said first or second IF signals;
an IF module which receives said first or second IF signal, performs analog-to-digital conversion on said first or second IF signal, and demodulates said digitally converted IF signal;
a synthesizer module which receives a programmable reference signal, downconverts said reference signal to an IF feedback signal, downconverts said reference signal to a baseband feedback signal, provides said IF feedback signal to said IF module, and provides said baseband feedback signal to said receiver module;
a programmable reference signal generator comprising an integrated circuit configured to sample said digitally converted IF signal, said integrated circuit comprising a numerically controlled oscillator configured to provide said programmable reference signal to said synthesizer module;
said programmable reference signal generator configured to provide a demodulated output signal derived from said digitally converted IF signal; and
a frequency locking circuit; and
a data processing unit ("DPU") operatively connected to said backplane, said DPU having a first and a second common reference signal generator, wherein each said common reference generator is switchably connected to said programmable reference signal generator via said frequency locking circuit.

9. The system of claim 8 wherein said DPU further comprises a second switch adaptable to switch from a first of said plural receivers to a second of said plural receivers.

10. The system of claim 9 wherein said switching occurs as a result of an error or failure in said first receiver.

11. The system of claim 10 wherein said switching occurs as a function of a quality measurement of said RF or IF signal.

12. The system of claim 11 wherein said quality measurement is selected from the group consisting of: signal strength, signal to noise ratio, bit error rate, and received power level.

13. The system of claim 8 wherein the number of said plural receivers is selected from the group consisting of: two, three, four, five, six, seven, and eight.

14. The system of claim 8 wherein said integrated circuit comprises a digital detector configured to sample said digitally converted IF signal.

15. The system of claim 8 wherein said integrated circuit comprises a field programmable gate array.

16. The system of claim 8 further comprising a temperature compensation module configured to regulate temperature of said each receiver based on temperature sensed from said IF module in said each receiver.

17. The system of claim 16 wherein said temperature compensation module includes a temperature sensor located in proximity to said IF module.

18. A method for receiving a signal comprising the steps of:
providing a co-located modem and receiver in an assembly;
receiving a baseband signal at a receiver module in said receiver;
providing a baseband in-phase ("I") signal and a baseband quadrature ("Q") signal;
eliminating a sideband of said I signal and a sideband of said Q signal to create a first and a second signal;
downconverting said first and second signal to a first and a second intermediate frequency ("IF") signal;
selecting one of said first or second IF signals;
performing analog-to-digital conversion on said first or second IF signal by an IF module;
sampling, using an integrated circuit, said digitally converted IF signal;
providing, using a numerically controlled oscillator in said integrated circuit, a reference signal as a function of said sampled IF signal;
providing a baseband feedback signal to said receiver module as a function of said reference signal;
providing an IF feedback signal to said IF module as a function of said reference signal;
demodulating said digitally converted IF signal to thereby provide a demodulated output signal; and
providing thermal compensation for temperature changes in said receiver based on temperature changes in said IF module.

19. The method of claim 18 wherein said reference signal is a programmable reference signal.

20. The method of claim 19 wherein said integrated circuit comprises a field programmable gate array.

21. The method of claim 18 wherein the step of providing a reference signal further comprises providing a common reference signal to the modem and receiver.

22. The method of claim 18 wherein the step of providing a reference signal further comprises locking a local oscillator to a reference frequency as a function of an alarm.

23. The method of claim 18 further comprising the step of switching to a standby receiver to receive the baseband signal if said receiver fails.

24. The method of claim 18 wherein said receiver is a hitless receiver for a cross polarization interference cancellation application.

25. The method of claim 18 wherein said receiver is a dual port receiver for 1:N space diversity.

26. The method of claim 18 further comprising the step of monitoring received signal strength.

* * * * *